US010032743B2

(12) United States Patent
Bayerer et al.

(10) Patent No.: US 10,032,743 B2
(45) Date of Patent: Jul. 24, 2018

(54) METHOD FOR PRODUCING A SEMICONDUCTOR MODULE

(71) Applicant: Infineon Technologies AG, Neubiberg (DE)

(72) Inventors: Reinhold Bayerer, Warstein (DE); Winfried Luerbke, Sundern (DE)

(73) Assignee: Infineon Technologies AG, Neubiberg (DE)

( * ) Notice: Subject to any disclaimer, the term of this patent is extended or adjusted under 35 U.S.C. 154(b) by 469 days.

(21) Appl. No.: 14/296,678

(22) Filed: Jun. 5, 2014

(65) Prior Publication Data

US 2014/0370663 A1    Dec. 18, 2014

(30) Foreign Application Priority Data

Jun. 18, 2013 (DE) .................. 10 2013 211 405

(51) Int. Cl.
*H01L 21/44* (2006.01)
*H01L 29/40* (2006.01)
(Continued)

(52) U.S. Cl.
CPC .......... *H01L 24/85* (2013.01); *H01L 21/4853* (2013.01); *H01L 21/4896* (2013.01);
(Continued)

(58) Field of Classification Search
CPC .... H01L 21/76802; H01L 23/34; H01L 23/24
(Continued)

(56) References Cited

U.S. PATENT DOCUMENTS 5,205,463 A * 4/1993 Holdgrafer ............ H01L 24/48
228/102
5,495,667 A 3/1996 Farnworth et al.
(Continued)

FOREIGN PATENT DOCUMENTS

CN         1219767 A   6/1999
CN       102456652 A   5/2012
(Continued)

OTHER PUBLICATIONS

International Electrotechnical Commission. International Standard IEC 60352-2. Soderless Connections—Part 2: Crimped Connections—General Requirements, Test Methods, and Practical Guidance. (2006). pp. 1-111.*

*Primary Examiner* — Calvin Lee
(74) *Attorney, Agent, or Firm* — Murphy, Bilak & Homiller, PLLC

(57) ABSTRACT

A semiconductor module is produced by providing a circuit carrier having a metallization, an electrically conductive wire and a bonding device. With the aid of the bonding device, a bonding connection is produced between the metallization and a first section of the wire. A separating location and a second section of the wire, the second section being spaced apart from the separating location, are defined on the wire. The wire is reshaped in the second section. Before or after reshaping, the wire is severed at the separating location, such that a terminal conductor of the semiconductor module is formed from a part of the wire. The terminal conductor is bonded to the metallization and having a free end at the separating location.

18 Claims, 20 Drawing Sheets

(51) Int. Cl.
*H01L 23/00* (2006.01)
*H01L 23/48* (2006.01)
*H01L 21/48* (2006.01)
*H01L 23/498* (2006.01)
*H01L 23/053* (2006.01)

(52) U.S. Cl.
CPC ........ *H01L 23/48* (2013.01); *H01L 23/49861* (2013.01); *H01L 24/49* (2013.01); *H01L 23/053* (2013.01); *H01L 24/48* (2013.01); *H01L 2224/45147* (2013.01); *H01L 2224/48091* (2013.01); *H01L 2224/48227* (2013.01); *H01L 2224/48472* (2013.01); *H01L 2224/4903* (2013.01); *H01L 2224/85* (2013.01); *H01L 2224/85205* (2013.01); *H01L 2924/00011* (2013.01); *H01L 2924/00014* (2013.01); *H01L 2924/12042* (2013.01); *H01L 2924/1301* (2013.01); *H01L 2924/13055* (2013.01); *H01L 2924/13062* (2013.01); *H01L 2924/13091* (2013.01); *H01L 2924/19107* (2013.01); *Y02P 80/30* (2015.11)

(58) Field of Classification Search
USPC .................. 257/780–784, 738; 438/613–617
See application file for complete search history.

(56) References Cited

U.S. PATENT DOCUMENTS

| | | | |
|---|---|---|---|
| 9,153,519 | B2 * | 10/2015 | Nagaune |
| 2001/0042925 | A1 | 11/2001 | Yamamoto et al. |
| 2002/0130676 | A1 | 9/2002 | Beaman et al. |
| 2011/0186999 | A1 | 8/2011 | Momose et al. |
| 2013/0095610 | A1 | 4/2013 | Chau et al. |
| 2014/0220744 | A1 * | 8/2014 | Damberg .............. H01L 25/105 438/127 |
| 2015/0129646 | A1 * | 5/2015 | Haba ................... H01L 21/4885 228/159 |

FOREIGN PATENT DOCUMENTS

| | | |
|---|---|---|
| CN | 102883848 A | 1/2013 |
| CN | 103035542 A | 4/2013 |
| EP | 0727818 A1 | 8/1996 |
| JP | 2009147103 A | 7/2009 |

* cited by examiner

METHOD FOR PRODUCING A SEMICONDUCTOR MODULE

PRIORITY CLAIM

This application claims priority to German Patent Application No. 10 2013 211 405.2, filed on 18 Jun. 2013, the content of said German application incorporated herein by reference in its entirety.

TECHNICAL FIELD

The present invention relates to semiconductor modules.

BACKGROUND

Electrical terminal conductors are used in such modules and serve for making electrical contact with one or a plurality of semiconductor chips of the semiconductor module. In this case, the electrical terminal conductors can be led out of a housing of the semiconductor module. In general, such a terminal conductor is mechanically and electrically conductively connected to a conductor track to which the semiconductor chip with which electrical contact is to be made is also connected. For this purpose, such a conventional terminal conductor can be connected to the conductor track cohesively, for example by soldering, sintering, laser welding or ultrasonic bonding. It is likewise known to plug a terminal conductor into a spring sleeve soldered onto the conductor track. A further known variant consists in inserting a terminal conductor—which has a bent-over base region—into a side wall of a module housing and connecting the base region to the conductor track by means of a bonding wire connection. On the outer side of the module housing, the terminal conductor can have a soldering, pressing, spring or screw terminal.

In the variants in which the terminal conductor is plugged into a spring sleeve, the terminal conductor is embodied as a straight pin, such that the position of the external terminal formed by the pin is predefined by the position of the spring sleeve. This is associated with low flexibility in the choice of suitable positions. Moreover, the method is complicated since a spring sleeve has to be prefabricated by stamping and bending, connected to the conductor track and then equipped with a likewise prefabricated terminal pin.

In other variants, the terminal conductor is embodied as a stamped and bent busbar, which is connected to the conductor track at a base point of the busbar during the production of the module. The position of the base point is defined by the three-dimensional shape formed during stamping and bending. The same correspondingly applies to the outer position of the terminal contacts. In the case of such busbars, the base points generally do not lie above the outer terminal points, but rather laterally offset. The disadvantage of this variant is that different terminal conductors of the semiconductor module generally have different shapes and then also have to be prefabricated in different stamping and bending processes, which is associated with high complexity.

In the variant in which the terminal conductor is inserted into a side wall of the housing and is connected by bonding wire connections, the relevant conductor track has to be led near the side wall of the housing and thus near the edge of the circuit carrier. However, this method requires many different process steps such as, for example, producing a terminal conductor by stamping and bending, inserting the terminal conductor prefabricated in this way into the side wall of the housing, and connecting the inserted terminal conductor by wire bonding.

A further disadvantage common to all the variants is that material waste arises as a result of the stamping processes respectively required.

SUMMARY

Embodiments described herein provide a method for producing a semiconductor module in which a terminal conductor of the semiconductor module can be connected to a metallization of a circuit carrier in a simple manner and in which no or only little material waste arises.

A first method for producing a semiconductor module involves providing a circuit carrier having a metallization layer, and also an electrically conductive wire and a bonding device. With the aid of the bonding device, a bonding connection is produced between the metallization and a first section of the wire. A separating location and also a second section of the wire, said second section being spaced apart from the separating location, are defined on the wire. The wire is reshaped in said second section. Before or after reshaping, the wire is severed at the separating location, such that a terminal conductor of the semiconductor module is formed from a part of the wire, said terminal conductor being bonded to the metallization and having a free end at the separating location.

A second method for producing a semiconductor module involves providing a circuit carrier having a metallization layer, and also a terminal conductor and a bonding device. The terminal conductor provided has a first end section and a second end section opposite to the first end section. With the aid of the bonding device, a bonding connection is produced between the metallization layer and the first end section. After the process of producing the bonding connection, the second end section is bent over relative to the circuit carrier by a bending angle that is greater than or equal to 20° and less than or equal to 80°.

A third method for producing a semiconductor module involves providing a circuit carrier having a metallization layer, and also a terminal conductor, a bonding device and a module housing. The terminal conductor has a first section composed of an electrically conductive first material, a second section composed of an electrically conductive second material different than the first material, said second section being cohesively connected to the first section indirectly or directly, a first end section, and also a second end section opposite to the first end section, wherein the first end section is formed by a part of the first section and the second end section is formed by a part of the second section. With the aid of the bonding device, a bonding connection is produced between the metallization layer and the first section in such a way that the first end section is directly connected to the metallization layer. After the process of producing the bonding connection, the circuit carrier is arranged in the module housing in such a way that the second end section projects from the module housing.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes

FIG. 2, which includes

FIG. 3, which includes

FIG. 4, which includes

FIG. 5, which includes

FIG. 11, which includes

FIG. 14, which includes

FIG. 15, which includes

FIG. 16, which includes

FIG. 17, which includes

FIG. 18, which includes

DETAILED DESCRIPTION

Figure 1A:
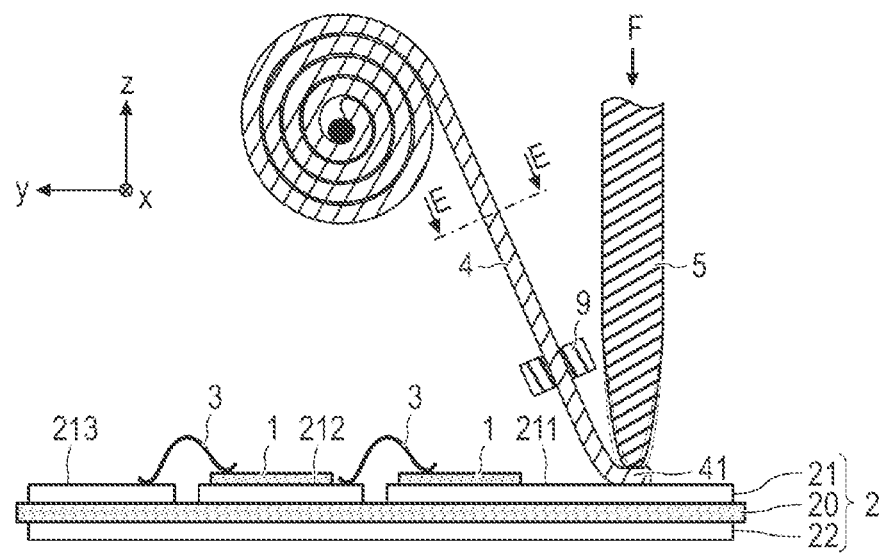
FIGS. 1A-1H and 1J, shows different steps of a method wherein a terminal conductor is formed from a wire by the wire being bonded to a conductor track in a first section, being reshaped in a second section and finally being separated.

A) Producing a Semiconductor Module Comprising a Terminal Conductor by Bonding a Quasi-Continuous Wire onto a Metallization Layer of a Circuit Carrier and Subsequently Separating a Section of the Quasi-Continuous Wire A method wherein a terminal conductor for a semiconductor module is produced from a quasi-continuous wire 4 is explained below with reference to FIGS. 1A-1H and 1J. The semiconductor module to be produced comprises a circuit carrier 2 having an upper metallization layer 21 and an optional lower metallization layer 22, which are arranged on mutually opposite sides of an isolation carrier 20. In order to realize a desired circuit layout, the upper metallization layer 21 can be structured as necessary to form conductor tracks and/or conductor areas 211, 212, 213. Optionally, the upper metallization layer 21 and the lower metallization layer 22 can be electrically insulated from one another by the isolation carrier 20.

The isolation carrier 20 can be, for example, a ceramic lamina, e.g. composed of aluminum oxide (Al2O3), aluminum nitride (AlN) or zirconium oxide (ZrO2). The circuit carrier 2 can be embodied, for example, as a DCB substrate (DCB=Direct Copper Bonding), as a DAB substrate (DAB=Direct Aluminum Bonding), as an AMB substrate (AMB=Active Metal Brazing) or as an IMS substrate (IMS=Insulated Metal Substrate).

The upper metallization layer 21 and/or the lower metallization layer 22 can consist of copper, e.g. completely or to the extent of at least 90% by weight (percent by weight), or of aluminum completely or to the extent of at least 90% by weight. Optionally, the upper metallization layer 21 and/or the lower metallization layer 22 can have one or a plurality of thin metallic coatings at least on its/their sides facing away from the isolation carrier 20, for example in order to improve solderability or sinterability there. Suitable materials for such metallic coatings are e.g. nickel, silver, gold, and palladium.

One or a plurality of semiconductor components 1 and optionally further components can be mounted on the upper metallization layer 21. The interconnection of the upper metallization layer 21, conductor tracks and/or conductor areas 211, 212, 213 possibly formed therefrom, and also semiconductor components 1 or other components mounted on the circuit carrier 2, can be carried out for example with the aid of bonding wires 3. Flexible printed circuit boards, metallic busbar arrangements, pressure contact connections or spring contact connections can likewise be used, including in any desired combinations with one another.

The upper and/or the lower metallization layer 21 and/or 22 can each have a thickness in the range of 0.05 mm to 2 mm, or of 0.25 mm to 2.5 mm. The thickness of the isolation carrier 20 can be less than or equal to 2 mm, and it can be e.g. in the range of 0.1 mm to 2 mm or in the range of 0.25 mm to 1 mm.

The semiconductor components 1 can be e.g. MOSFETs, IGBTs, junction field effect transistors, thyristors, diodes or any other semiconductor components in any desired combinations.

A wire 4 is used for producing a terminal conductor, said wire being provided as quasi-continuous material. The wire is expediently situated on a roll from which it can be unrolled in order to produce one or a plurality of terminal conductors.

With the aid of a bonding tool 5, for example an ultrasonic wire bonder, a first section 41 of the wire 4 is bonded to the upper metallization 21, here—merely by way of example—to the conductor track 211. Since a terminal conductor is intended to be produced from the wire 4, it must have a certain minimum stability, which can be achieved, for example, by the wire 4 provided having a large cross-sectional area. By way of example, the wire 4 provided can have a cross-sectional area of at least 0.6 mm$^2$ before it is deformed by a bonding device 5 having a sonotrode or in some other way. The production of the bonding connection between the first section 41 and the metallization 21 gives rise to a cohesive connection between the wire 4 and the metallization 21, in the case of which the wire 4 in the first section 41 is directly connected to the metallization 21.

After the wire 4 has been bonded on, it is connected to the metallization 21 in the region of the first section 41, such that its course can be brought to a desired shape with the aid of a wire guide 9 that is movable relative to the wire. Optionally, while a desired course of the wire 4 is set with the aid of the movable wire guide 9, the bonding location can be secured by means of a press-on device 11, by virtue of the press-on device 11 pressing the wire 4 in the region of the first section 41 and thus in the region of the bonding location against the conductor track 21.

Figure 1B:
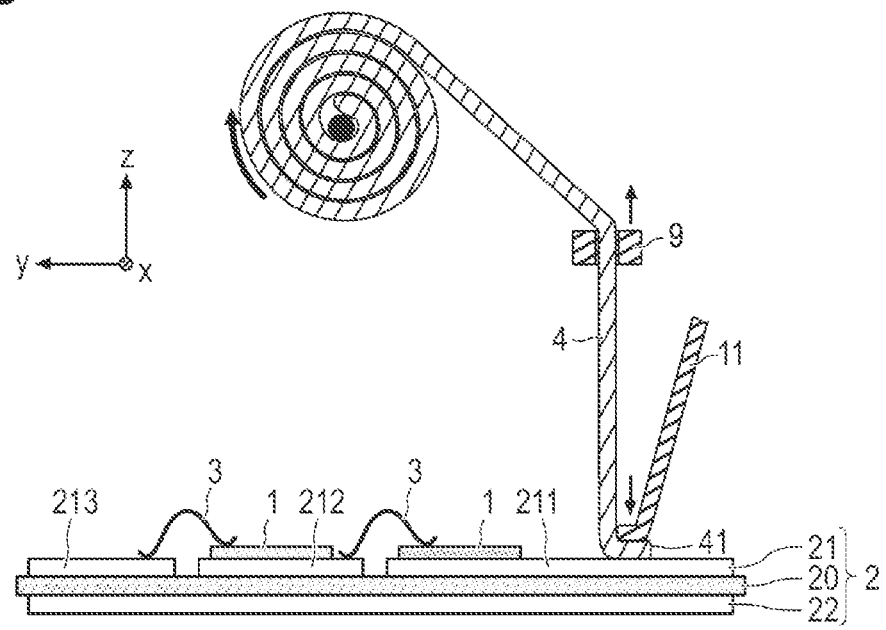

As is shown in FIG. 1B, after the course of the wire 4 has been set with the aid of the movable wire guide 9, said wire can optionally have a section running substantially perpendicularly to the top side of the circuit carrier 2. As is furthermore shown in FIG. 1O, the wire 4 is reshaped in a second section 42, which is spaced apart from the first section 41. The reshaping is carried out by means of a reshaping tool 6, in which the wire 4 is locally embossed between two parts 61, 62 of the reshaping tool 6 such that its shape changes in the second section 42. Any desired compressive reshaping technique, for example embossing, hammer forging or drop forging, can be used for the reshaping process.

In this case, the reshaping process can optionally be carried out "cold" (that is to say at room temperature), or "hot", that is to say at a temperature with the second section 42 being heated to a temperature above the recrystallization temperature of the material of the wire 4, or "semi-hot", that is to say at a temperature with the second section 42 being heated during the reshaping process to a temperature that is above 150° C. but below the recrystallization temperature of the material of the wire 4.

Figure 1C:
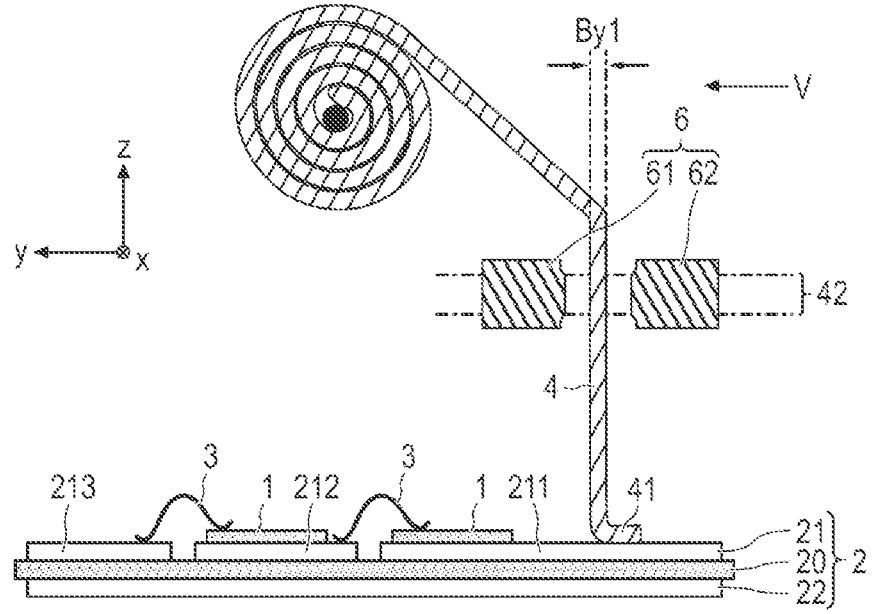
Figure 1D:
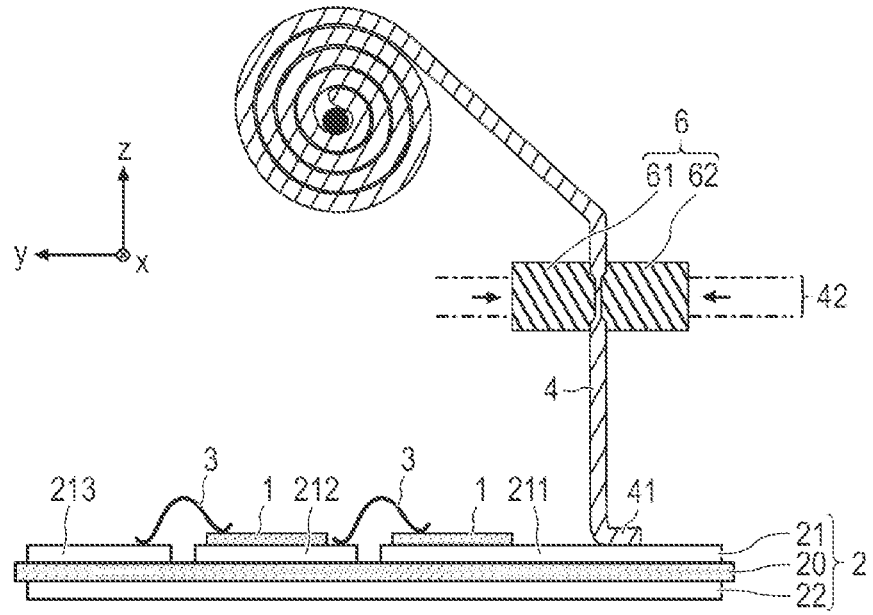
Figure 1E:
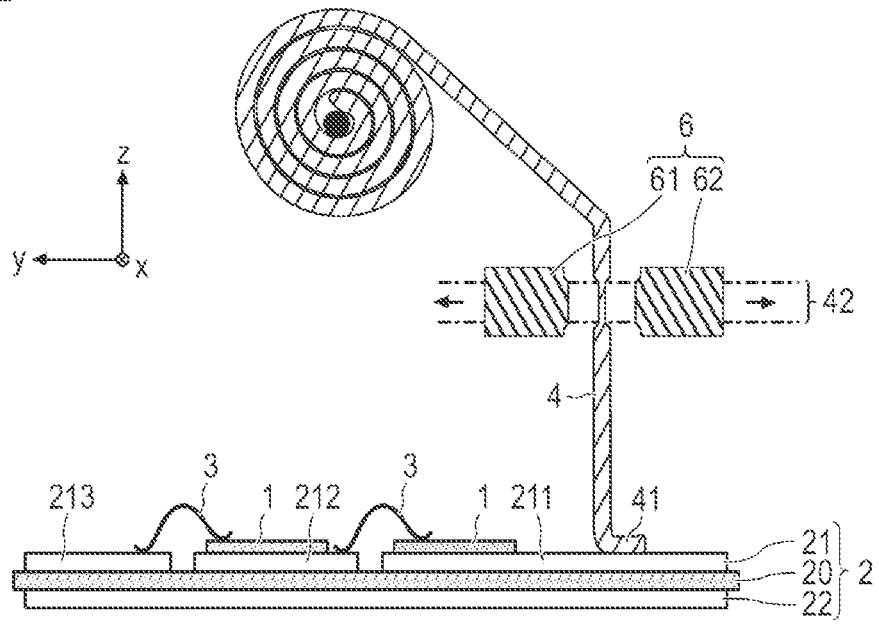

FIG. 1C shows the arrangement with the wire 4 bonded to the metallization 21 before the reshaping process with the reshaping tool 6 not yet closed, FIG. 1D with the reshaping tool 6 closed, and FIG. 1E after the reshaping process with the reshaping tool 6 having been opened again.

Figure 1F:
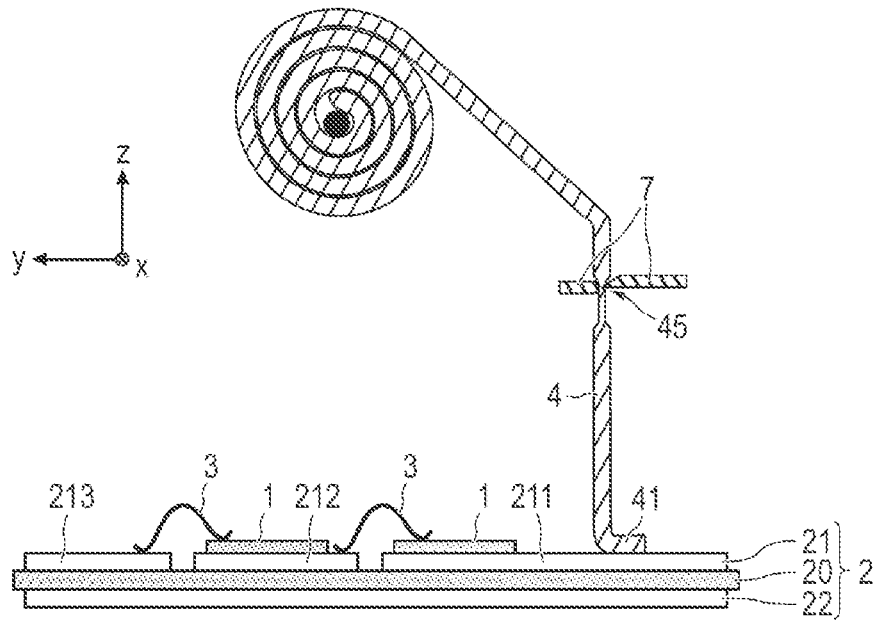

After the reshaping process, the wire 4, as is shown in FIG. 1F, can be separated at a predefined separating location 45 with the aid of a separating device 7, such that the separated section 49 of the wire 4 constitutes a terminal conductor 49 bonded to the upper metallization 21. FIG. 1H shows a side view of the arrangement in accordance with FIG. 1C, i.e. before the reshaping process, in a viewing direction V, and FIG. 1J shows the view in accordance with FIG. 1G, i.e. after the reshaping process.

Figure 1G:
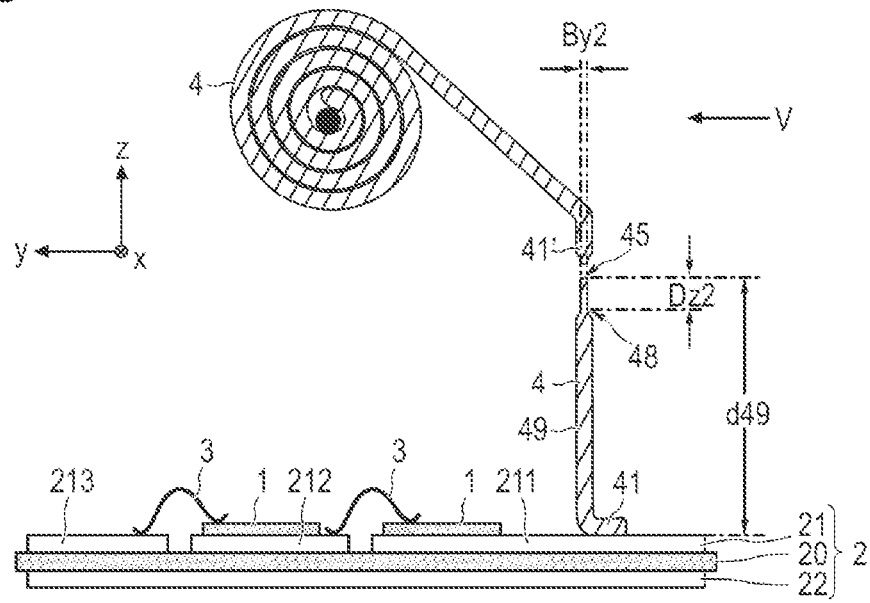
Figure 1H:
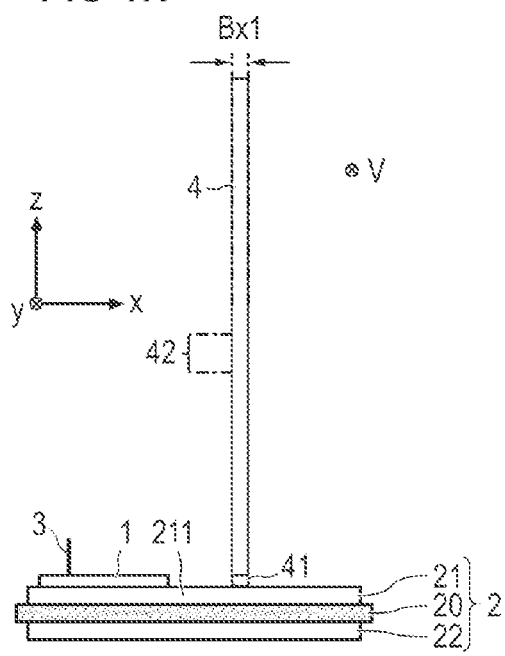

As is evident from a comparison of FIGS. 1C and 1G, optionally in the second section 42 the original width By1 of the wire 4 in a first direction y perpendicular to the direction of its course can be reduced to a width By2 by the reshaping process. The wire 4 can therefore have in the second section 42 in the first direction y before reshaping a first minimum width By1, and after reshaping a second minimum width By2, which is less than the first minimum width By1 by at least 30% of the first minimum width By1. Optionally, in this case, a first location 48 of the second section 42, at which first location said second section has the second minimum width By2 after reshaping in the first direction y, can be spaced apart from the separating location 45 by a distance Dz2 of at least the first minimum width By1.

Figure 1J:
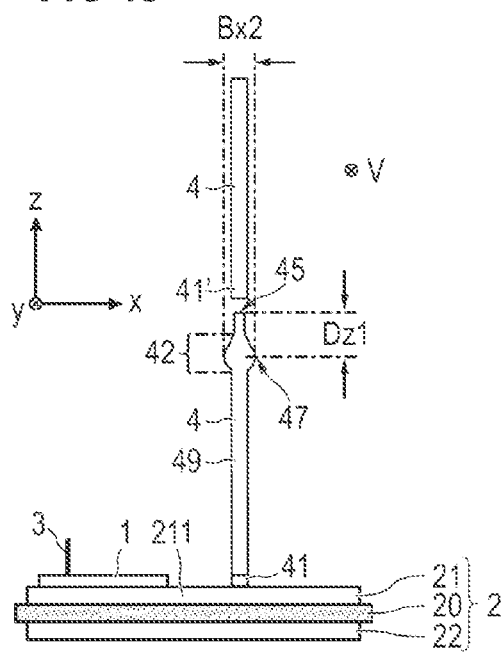

Correspondingly, as is evident from a comparison of FIGS. 1H and 1J, in the second section 42 the original (first) maximum width Bx1 of the wire 4 in a second direction x perpendicular to the direction of its course in the second section 42 can be increased to a (second) maximum width Bx2 by the reshaping process, the second maximum width Bx2 also being present in the second section 42. The wire 4 can therefore have in the second section 42 in the second direction x before reshaping a first maximum width Bx1, and after reshaping a second maximum width Bx2, which can be greater than the first maximum width Bx1 e.g. by at least 20% of the first minimum width By1. Optionally, in this case, a second location 47 of the second section 42, at which second location said second section has the second maximum width Bx2 after reshaping in the second direction x, can be spaced apart from the separating location 45 by a distance Dz1 corresponding at least to the second maximum width Bx2.

Figure 2A:
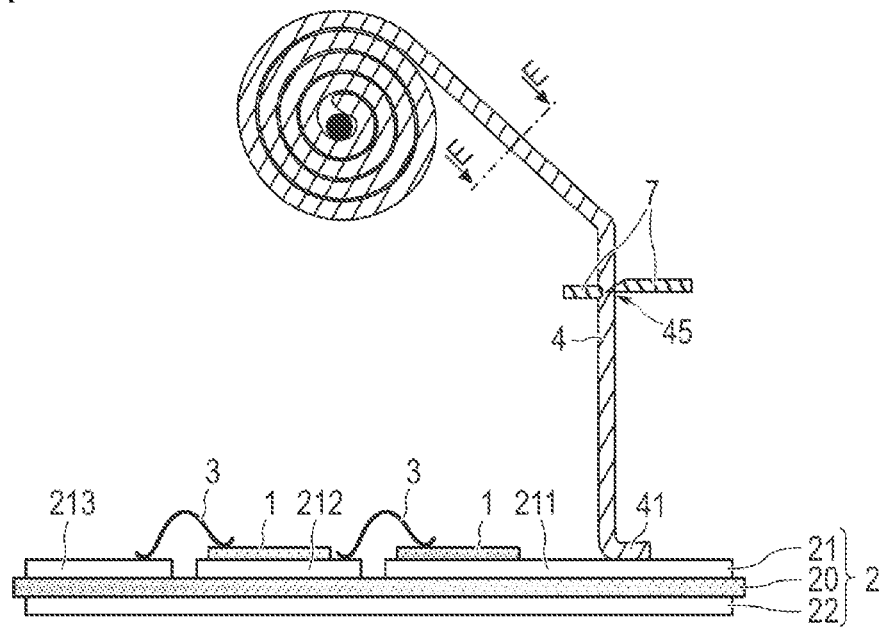
FIGS. 2A-2D, shows different steps of an alternative method, which differs from the method explained with reference to FIGS. 1A to 1J in that the process of reshaping the wire in the second section takes place after the separating process.
Figure 2B:
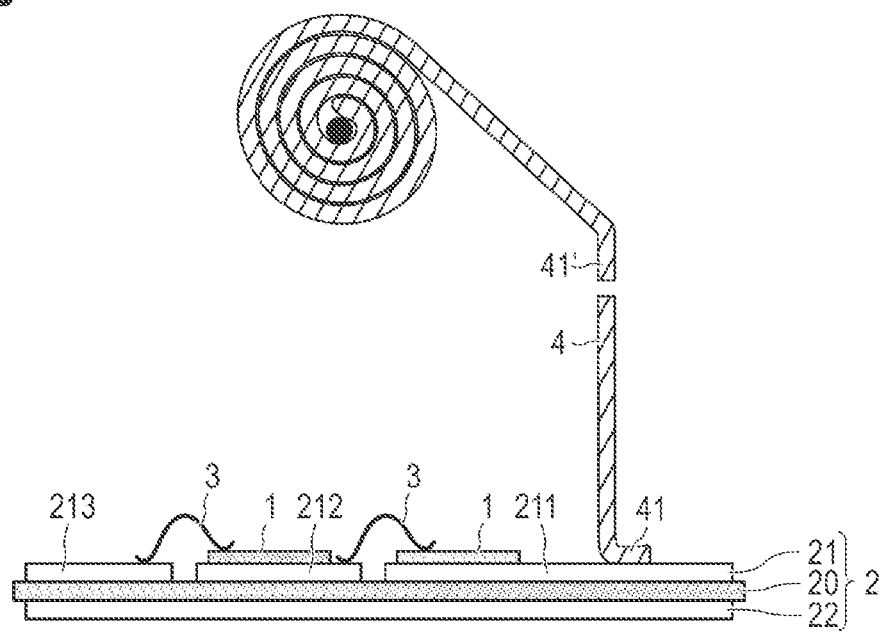
Figure 2C:
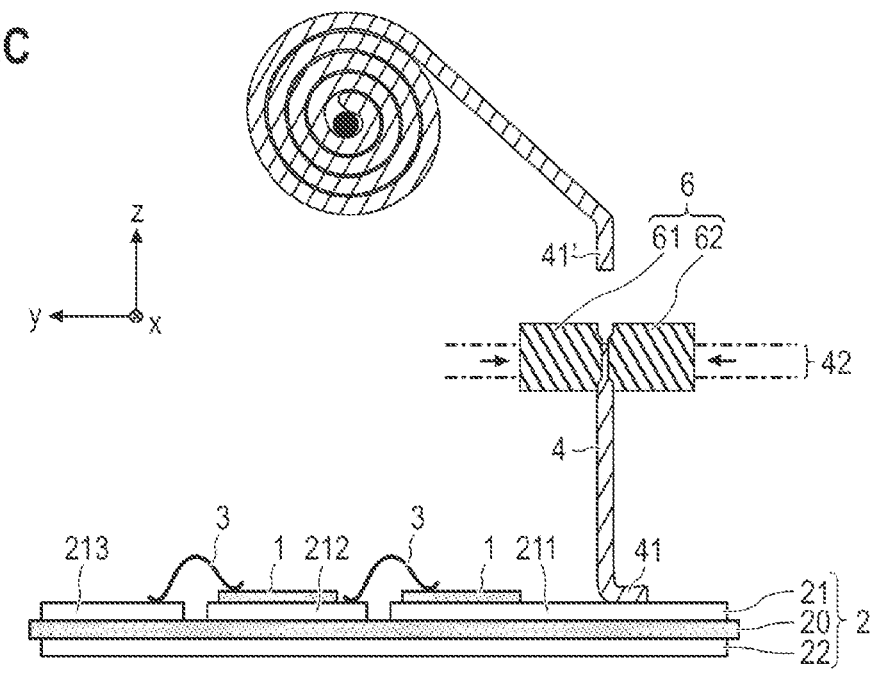
Figure 2D:
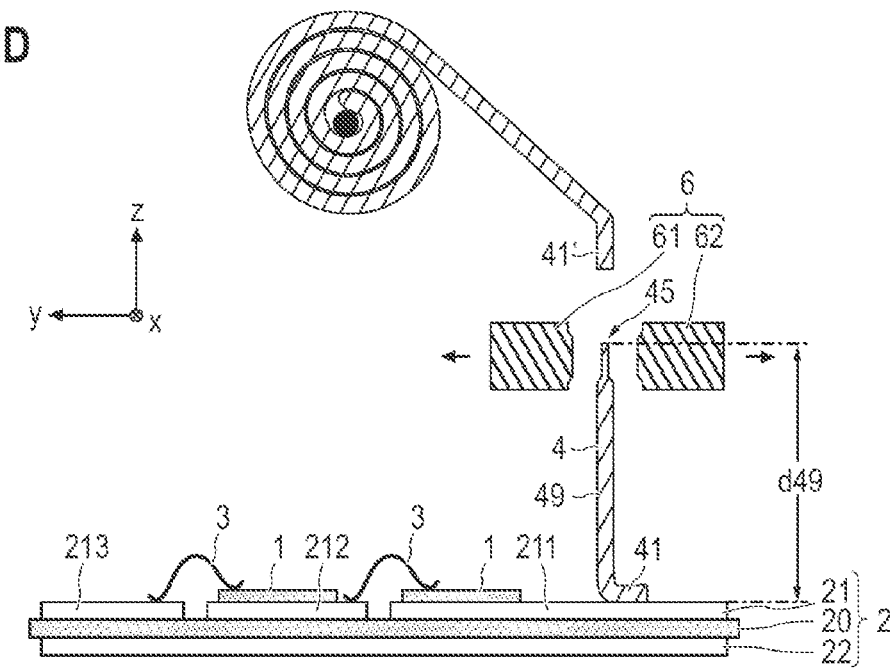
Figure 3A:
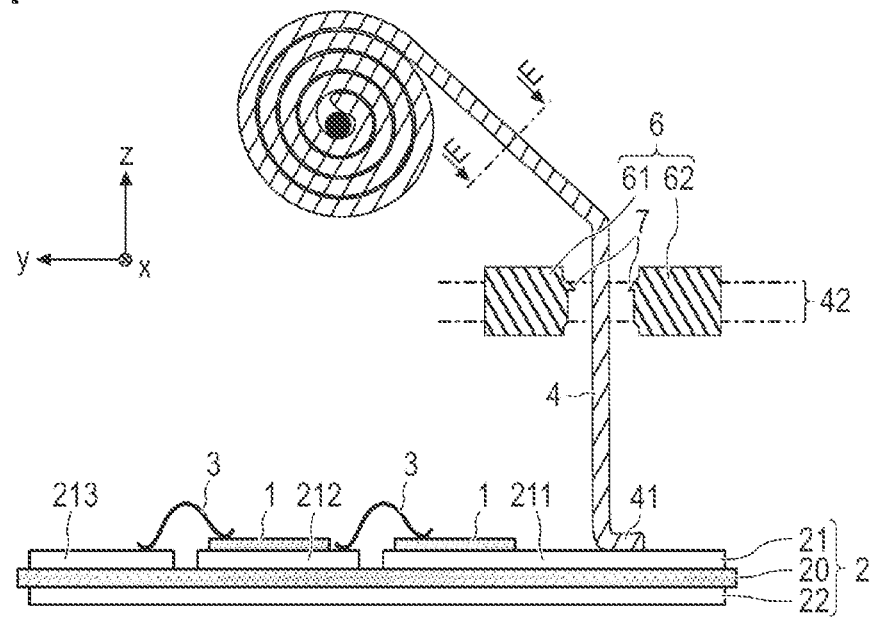
FIGS. 3A-3D, shows different steps of a further alternative method, which differs from the method explained with reference to FIGS. 1A to 2D in that the processes of reshaping and separating the wire are carried out using a common tool.
Figure 3B:
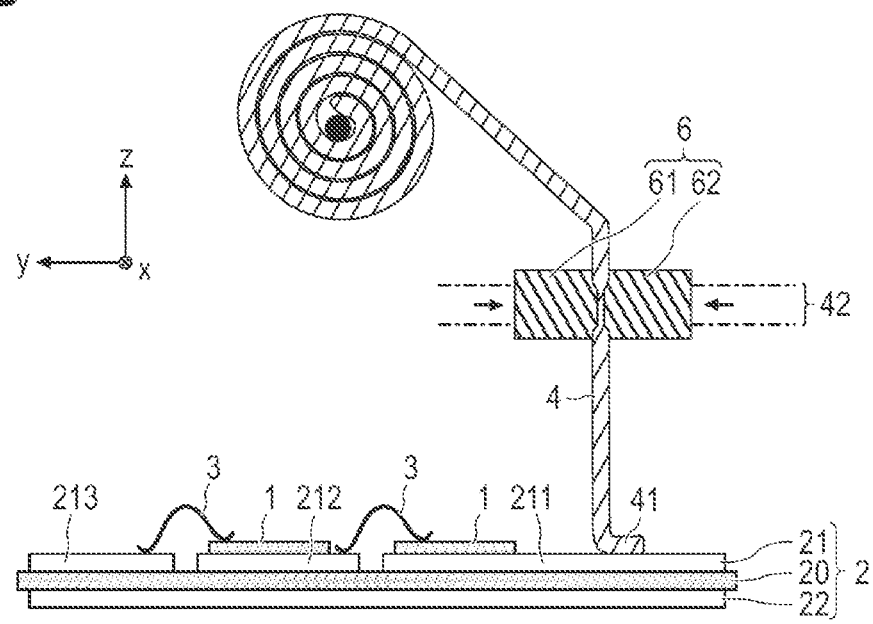
Figure 3C:
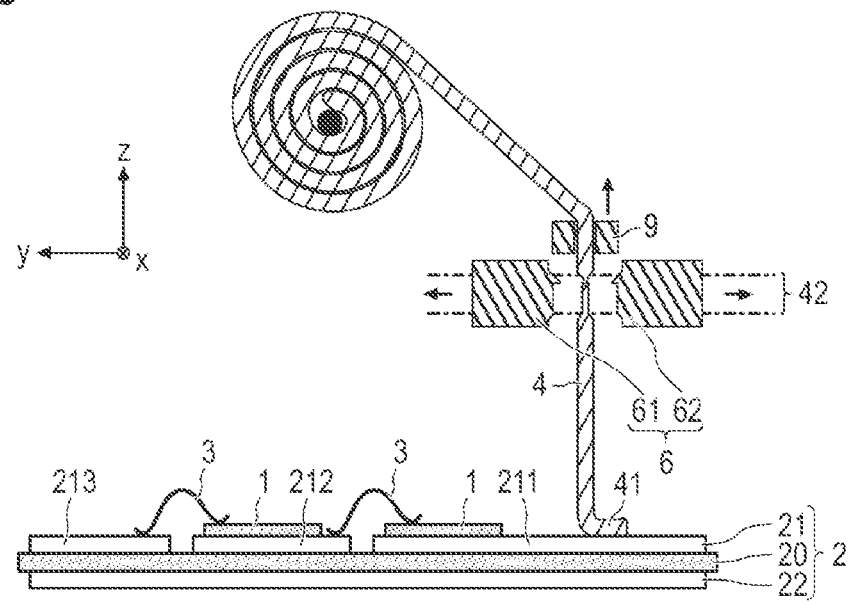
Figure 3D:
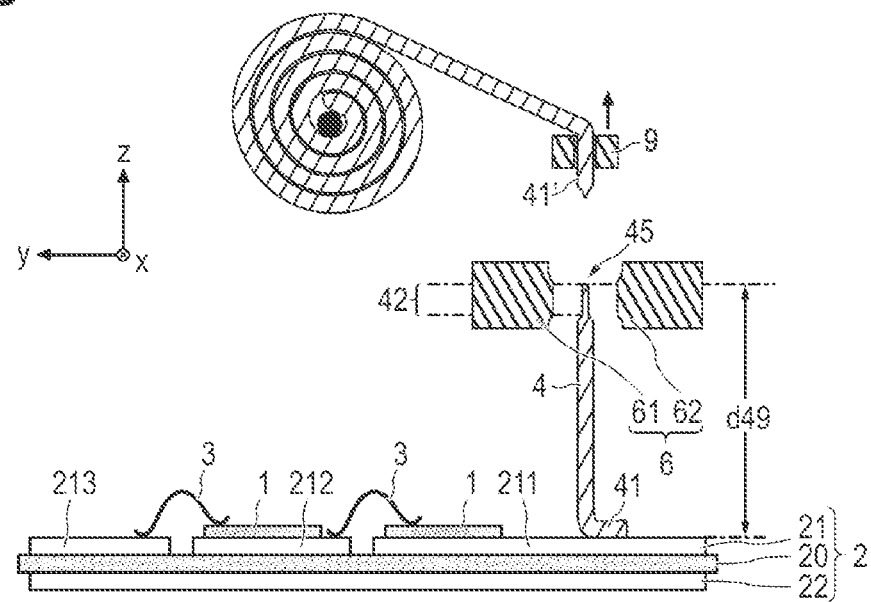

In a departure from the method described with reference to FIGS. 1A-1H and 1J, the process of reshaping the wire 4 in the region of the second section 42 can also take place only after the wire 4 has been separated, which will be explained by way of example with reference to FIGS. 2A to 2D. Firstly, the bonding of the wire 4 in the first section 41 onto the metallization 21 and the subsequent fashioning of the course of the bonded wire 4 can be carried out in the manner explained above and with reference to FIGS. 1A and 1B. Afterward, as shown in FIG. 2A, the wire 4 can be separated at a predefined separating location 45 using a separating tool 7, the result of which is shown in FIG. 2B. After the separating process, a separated section of the wire 4, said section being bonded to the metallization 21, can be reshaped in the region of a second section 42 with the aid of a reshaping tool 6 explained with reference to FIGS. 1C to 1E and with the aid of a method likewise explained, this being illustrated in FIGS. 2C and 2D. FIG. 2C shows the arrangement with the reshaping tool 6 closed, and FIG. 2D with the reshaping tool 6 open. As a result, this leads to a terminal conductor 49 bonded onto the metallization 21.

In accordance with yet another method, explained with reference to FIGS. 3A to 3D, the processes of reshaping and separating the wire 4 can be carried out using a common tool. The steps already explained with reference to FIGS. 1A and 1B are followed by a step explained with reference to FIG. 3A, which step differs from the step explained with reference to FIG. 1O merely in that the reshaping tool 6 has an integrated separating device 7. During the closing of the parts 61 and 62 of the reshaping tool 6, the wire 4 is firstly reshaped in the second section 42 and then finally separated by the separating device 7, this being shown in FIGS. 3B to 3D. As an alternative thereto, the cross section of the wire 4 can, without the wire 4 being completely severed, also be reduced by the separating device 7 only to an extent such that it can subsequently be torn away using the reshaping tool 6.

Figure 4A:
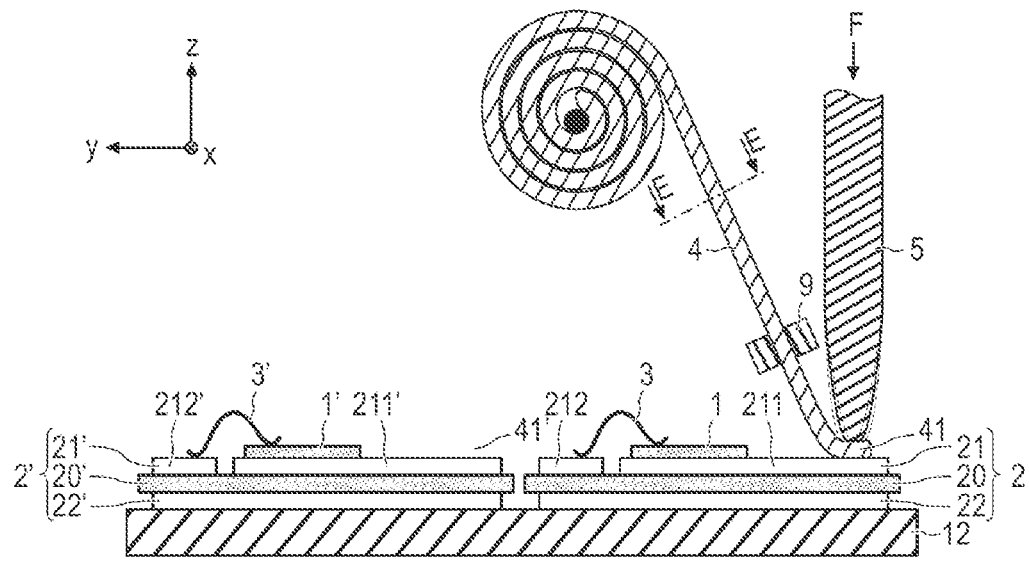
FIGS. 4A-4D, shows different steps of a method wherein a quasi-continuous wire is used both for producing a module-internal electrical connection between two bonding locations and for producing a terminal conductor having a free end.
Figure 4B:
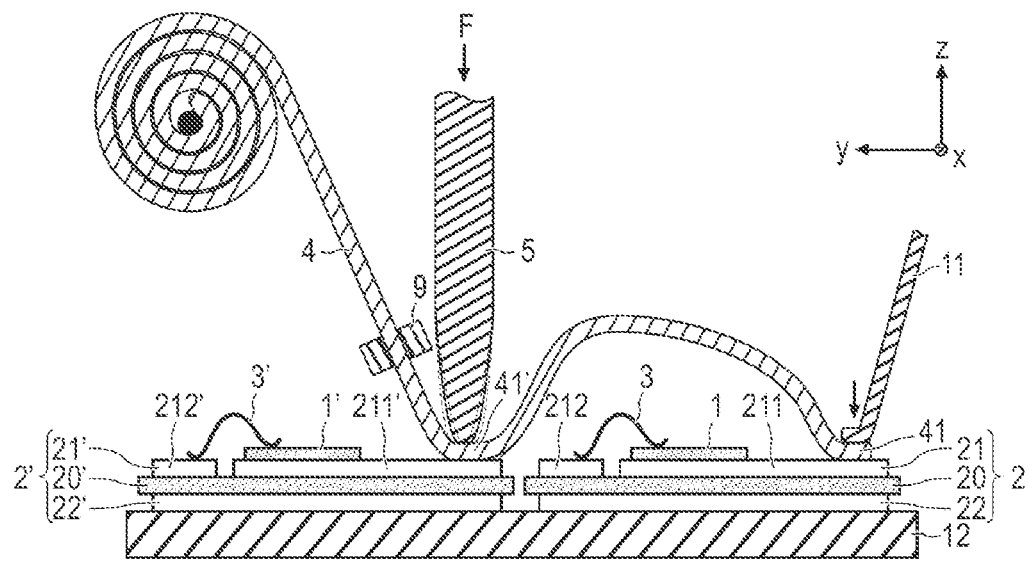
Figure 4C:
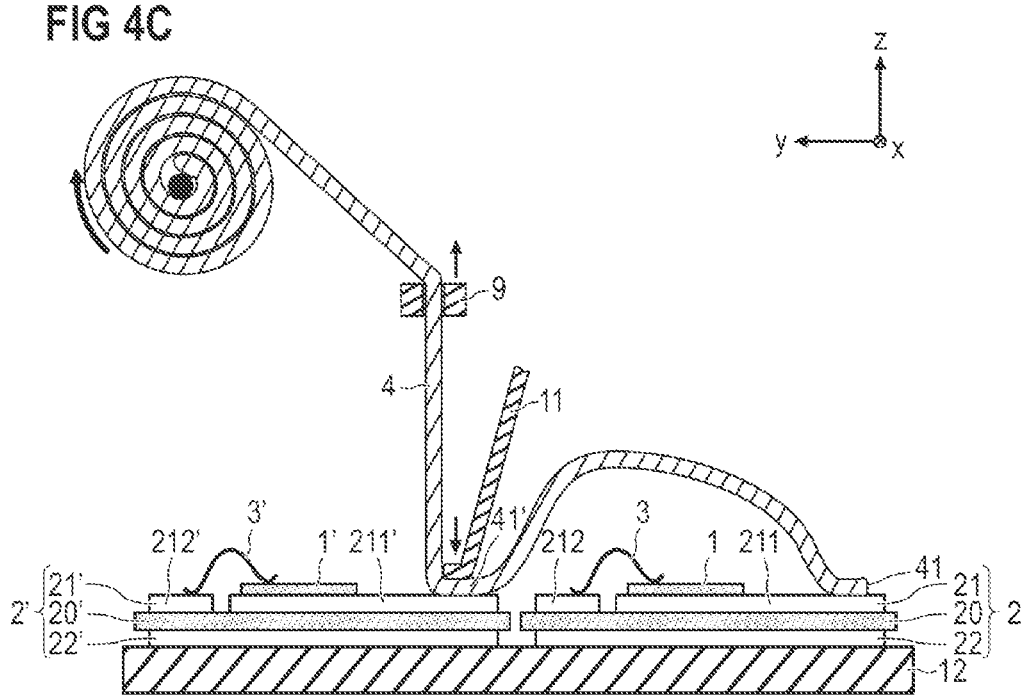
Figure 4D:
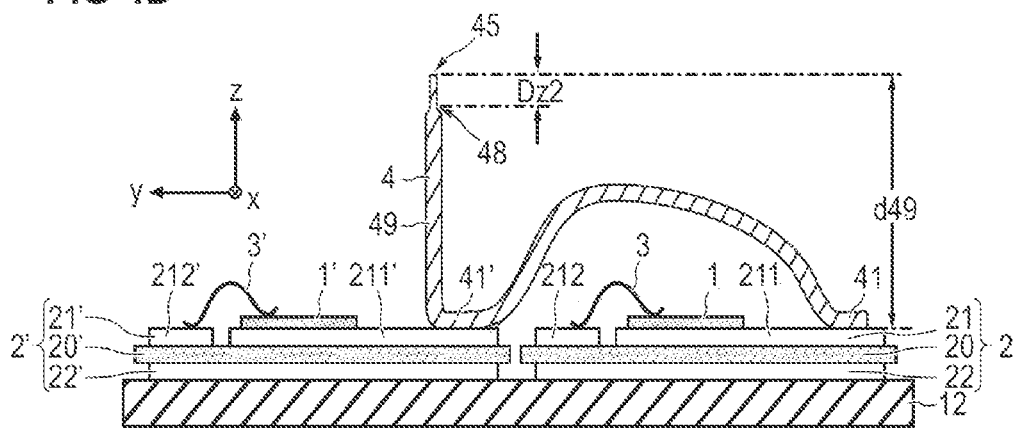

A further advantage of the invention is explained below on the basis of an example shown in FIGS. 4A to 4D. In this case, the quasi-continuous wire 4 used for producing a terminal conductor 49 is also used to produce a module-internal connection. For this purpose, the wire 4, as is shown as the result in FIG. 4D, is bonded onto different locations of the semiconductor module successively at two first sections 41 and 41'.

In the example shown, the semiconductor module comprises a baseplate 12, on which two identically constructed and identically populated circuit carriers 2, 2' are mounted. The reference signs of identical components of the two circuit carriers 2, 2' differ merely in a prime. In order to enable a higher current to be switched by the semiconductor module, the two circuits realized on the circuit carriers 2 and 2' are electrically connected in parallel. For this purpose, the corresponding conductor tracks 211 and 211' of the metallization layers 21 and 21', respectively, are electrically conductively connected to one another with the aid of the wire 4. As is shown in FIG. 4A, for this purpose firstly a first section 41 of the wire 4, as already explained above with reference to FIG. 1A, is bonded onto the conductor track 211. Afterward, a further first section 41' of the bonded wire 4 is positioned on the conductor track 211' using the movable wire guide 9 and, as is shown in FIG. 4B, is bonded onto the conductor track 211' with the aid of the bonding device 5. In this case, too, the two bonding connections can be produced by means of an ultrasonic bonding method. Optionally, the first bonding location between the first section 41 and the conductor track 211 can be secured by means of a press-on device 11, while the further first section 41' is brought to its target position on the conductor track 211'. For securing purposes, the press-on device 11 presses the wire 4 in the region of the first section 41 against the conductor track 21.

After the production of the bonding connection between the further first section 41' and the conductor track 211', proceeding from the further first section 41', a terminal conductor 49 is produced in the manner explained above with reference to FIGS. 1A-1H and 1J, or 2A to 2D, or 3A to 3D proceeding from the first section 41.

In principle, two or more module-internal connections with subsequent production of a terminal conductor 49 can be used for any other purposes as well as for electrically connecting in parallel two identically populated circuit carriers 2, 2'. Moreover, the two first sections 41 and 41' need not necessarily be bonded onto different circuit carriers 2, 2'. By way of example, the two first sections 41 and 41' can also be bonded onto different conductor tracks of the same circuit carrier or onto the same conductor track.

B) Producing a Semiconductor Module Comprising a Terminal Conductor by Bonding a Prefabricated Individual Terminal Conductor onto a Metallization Layer of a Circuit Carrier With reference to FIGS. 5A to 5G, an explanation will now be given of a method as to how a terminal conductor of a semiconductor module can be produced from a prefabricated individual terminal conductor 49 by means of the terminal conductor 49 being bonded onto a metallization layer 21 of a circuit carrier 2.

Figure 5A:
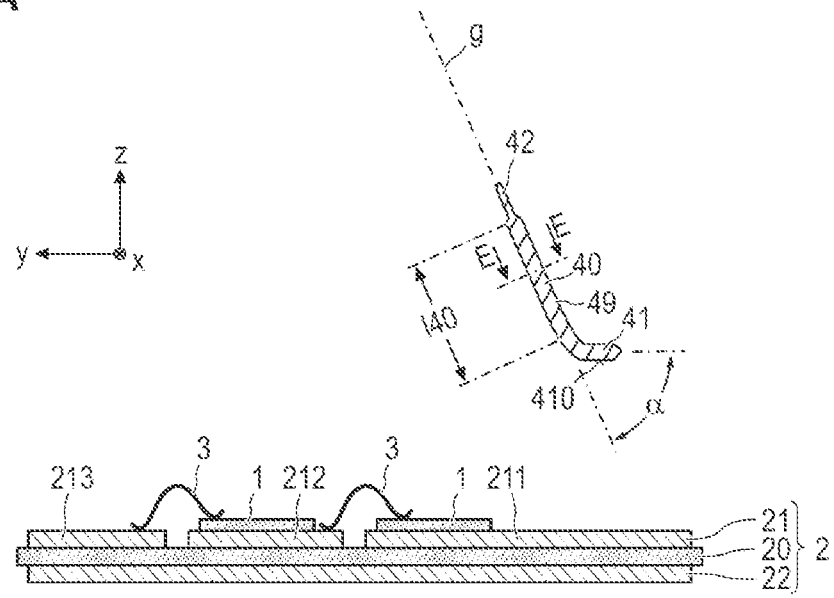
FIGS. 5A-5G, shows different steps of a method wherein a terminal conductor of a semiconductor module is produced from a prefabricated individual terminal conductor.

FIG. 5A shows a circuit carrier 2, which can have the same construction as the circuit carriers 2 explained above, and also an individual, prefabricated terminal conductor 49. The terminal conductor 49 has a first end section 41, and also a second end section 42 opposite to the first end section 41.

The terminal conductor 49 additionally has a shaft 40, relative to which the end section 41 can be pre-bent by an angle α that is greater than 0° and less than 90°. Such a pre-bend makes it possible to prevent the shaft 40 and/or the end section 42 from making the later positioning of a bonding device 5 more difficult. The angle α can be, for example, in the range of 10° to 70° or in the range of 20° to 70°. In a departure therefrom, however, it is also possible, in principle, to choose a pre-bend of α=90°, or else to dispense with a pre-bend, which corresponds to α=0°.

Figure 5B:
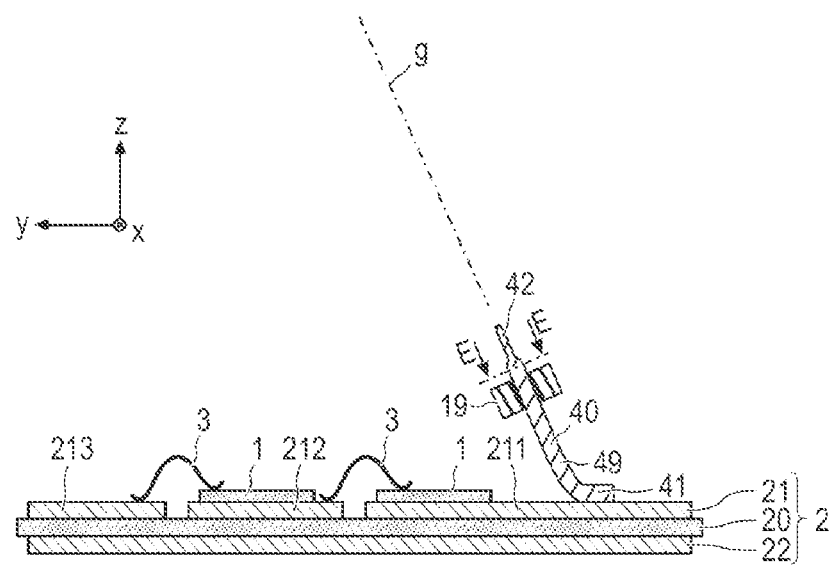
Figure 5C:
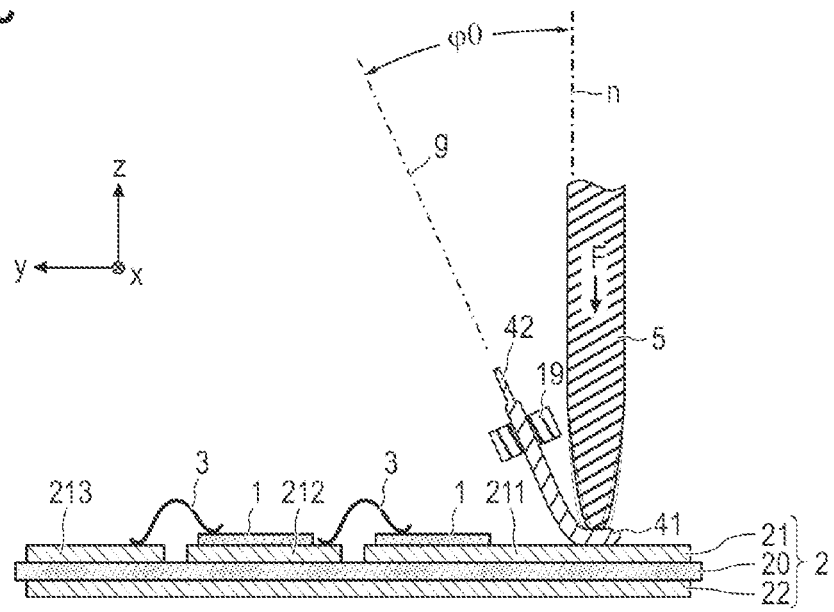

In order to bond the terminal conductor 49 onto the metallization layer 21 in the region of a later bonding location 410 of the terminal conductor 49, as is shown in FIG. 5B, the first end section 41 in the region of the later bonding location 410 of the terminal conductor 49 is placed onto the metallization layer 21 and then, as is illustrated in FIG. 5C, is bonded directly onto the metallization layer 21 with the aid of a bonding device 5. In this case, too, the bonding connection can be produced by means of an ultrasonic bonding method, as has already been explained above. As a result, the terminal conductor 49, at its first end section 41, is directly bonded onto the metallization layer 21.

After the production of this bonding connection, the second end section 42 of the terminal conductor 49 bonded onto the metallization layer 21 is bent over relative to the circuit carrier 2 by a bending angle φ1 that is greater than or equal to 20° and less than or equal to 80°. The bending angle φ1 can also be greater than or equal to 20° and less than or equal to 70°.

Figure 5D:
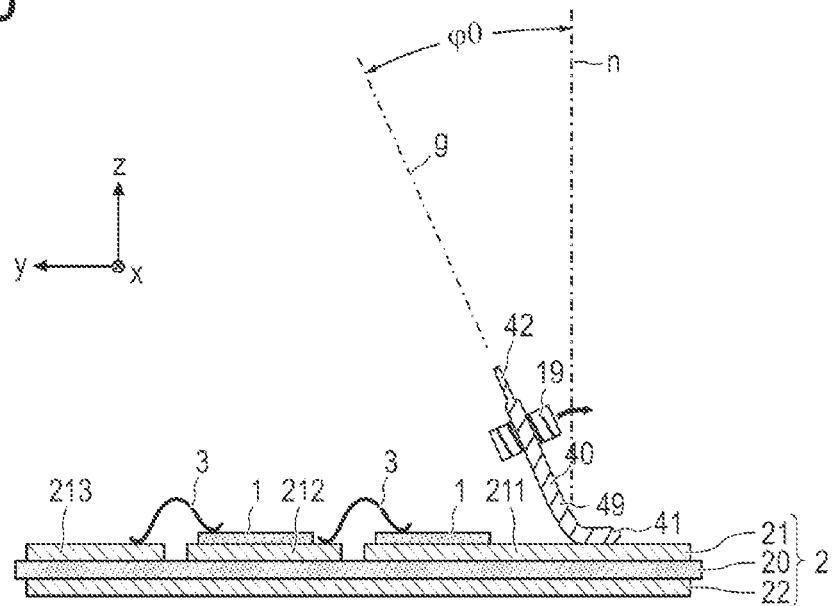

After the production of the bonding connection and before the bending-over process, the shaft 40, as is shown in FIG. 5D, forms an angle φ0 with the normal direction n perpendicular to the isolation carrier 20. In the present case, said angle φ0 is greater than 0°. Alternatively, the angle φ0 can also be equal to 0°, i.e. the shaft 40 can then run perpendicularly to the isolation carrier 20 and perpendicularly to the metallization layer 21.

Within the meaning of the present invention, shaft 40 is understood to be a section of the terminal conductor 49 which extends along a longitudinal axis identified by "g" in FIGS. 5A to 5F. Optionally, the shaft 40 can be embodied as a straight shaft. That means that the shaft has the same cross-sectional shape along the longitudinal axis g in any sectional plane E-E perpendicular to the longitudinal axis. Such a straight shaft 40 can have a length 140 of at least 4 mm.

Figure 5E:
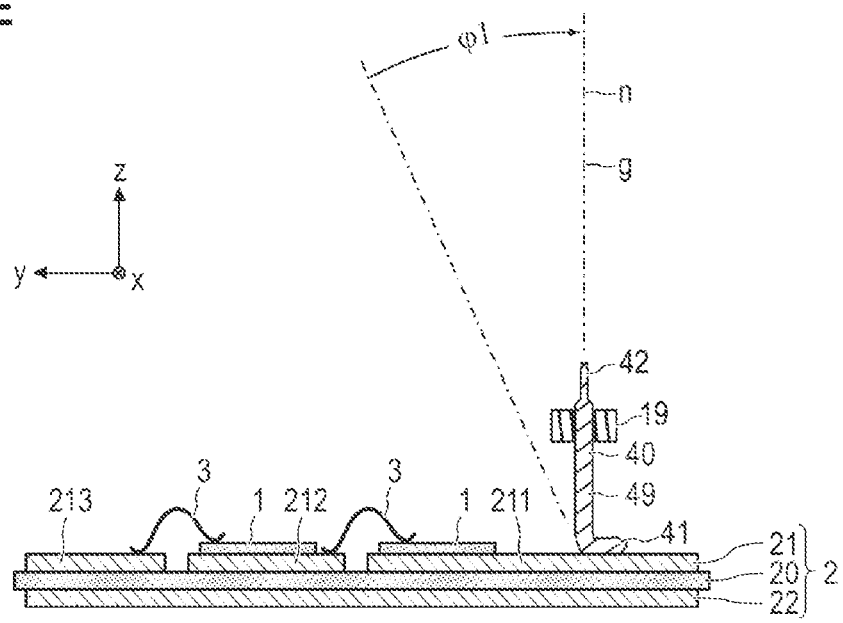
Figure 5F:
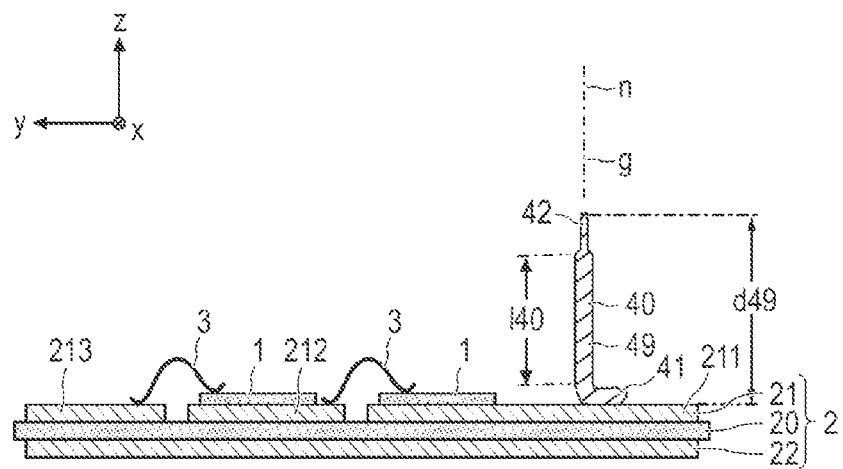
Figure 5G:
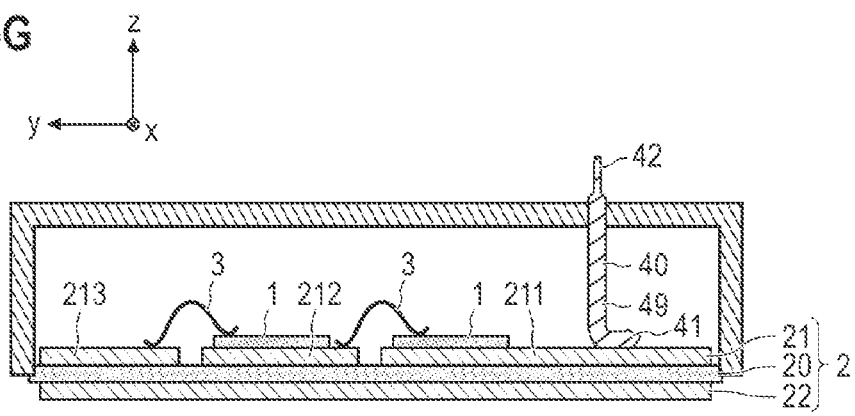

FIG. 5E shows the terminal conductor 49 bonded onto the metallization layer 21 after the bending-over process, and FIG. 5F after the removal of a holding tool 19.

The holding tool 19 can be used, as shown, to accommodate the prefabricated terminal conductor 49, bring it to the bonding position, hold it during the bonding process, and perform the bending-over by the bending angle φ1. Alternatively, the bending-over by the bending angle φ1 can also be carried out by means of a separate bending tool.

C) Examples of Prefabricated Individual Terminal Conductors which are Provided in a Magazine As will be explained by way of example below with reference to FIGS. 6 to 8, a multiplicity of prefabricated individual terminal conductors 49 can be provided in a magazine. In this case, the terminal conductors 49 can be embodied identically or differently.

Figure 6:
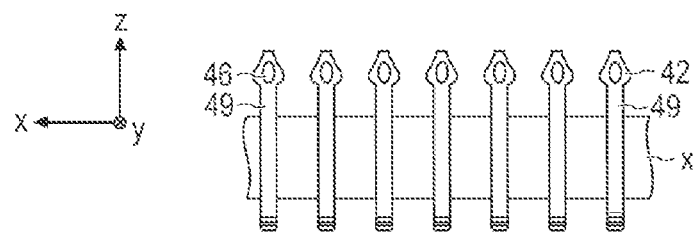
FIG. 6 shows an embodiment of prefabricated individual terminal conductors provided in a magazine.
Figure 7:
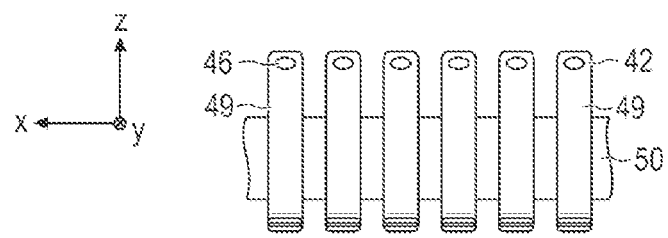
FIG. 7 shows another embodiment of prefabricated individual terminal conductors provided in a magazine.
Figure 8:
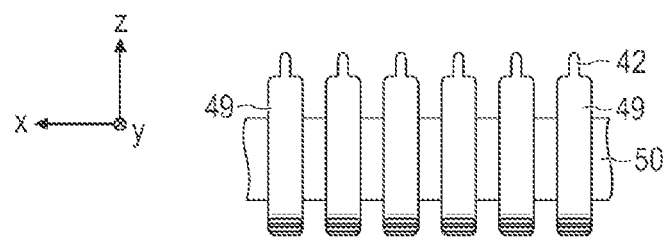
FIG. 8 shows yet another embodiment of prefabricated individual terminal conductors provided in a magazine.

In the examples shown in FIGS. 6 to 8, the terminal conductors 49 are taped by virtue of the fact that they are held in each case by one or alternatively a plurality of carrier strips 50. The terminal conductors 49 can be affixed on the carrier strip or carrier strips 50 for example by being adhesively bonded onto said strip(s) or plugged into said strip(s). Adjacent terminal conductors 49, such as are shown e.g. in FIG. 7, can optionally also be connected to one another by webs. The adjacent terminal conductors 49 are then singulated in the process by separation of the webs (tearing off, cutting off, stamping off or the like).

For the purpose of subsequently populating a circuit carrier 2 with one of the terminal conductors 49 provided in the magazine, for example by means of a method explained with reference to FIGS. 5A to 5G, the relevant terminal conductor 49 can be removed from the magazine, which can be done in the present example by the relevant terminal conductor 49 being pulled off the carrier strip 50.

Figure 9:
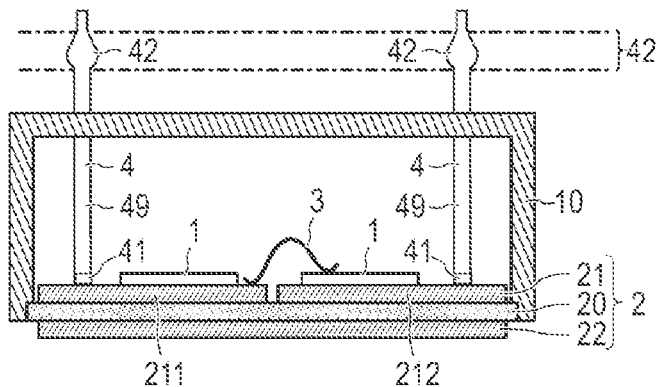
FIG. 9 shows a sectional view of a semiconductor module comprising a plurality of terminal conductors which are led out of a module housing and which each have a press-fit contact produced by embossing.

D) Various Configurations and Arrangements of One or a Plurality of Terminal Conductors Bonded onto a Circuit Carrier FIG. 9 shows a vertical sectional view through a semiconductor module comprising a circuit carrier 2 populated with a plurality of terminal conductors 49. Each of these terminal conductors 49 was produced by a method as explained above with reference to FIGS. 1A to 5G. The semiconductor module additionally has a housing 10. The housing 10 can be, for example, an electrically insulating housing based on thermosetting plastic. As can be discerned with reference to FIG. 9, the first sections 41 of the wire 4 or the first end sections 41 of the terminal conductor 49 are situated in the interior of the housing 10, whereas the reshaped second sections 42 or the second end sections 42 are situated on the outer side of the housing 10.

As is likewise illustrated schematically in FIG. 9, the reshaped second sections 42 or the second end sections 42 can be embodied in each case as press-fit contacts which enable the second sections 42 or the second end sections 42 to be press-fitted into an opening in, for example, a printed circuit board or a metallically conductive board or a metallic busbar arrangement.

Figure 10:
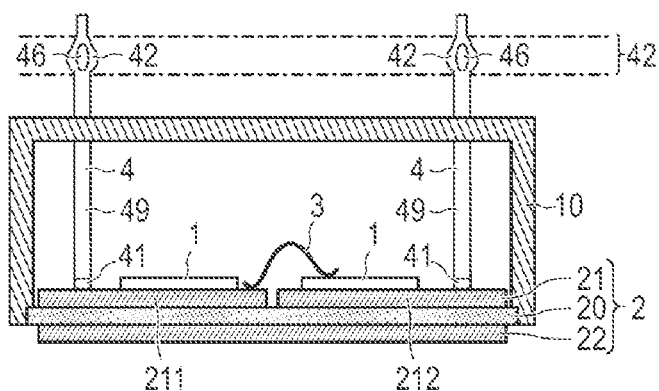
FIG. 10 shows a sectional view of a semiconductor module which differs from the semiconductor module in accordance with FIG. 9 in that the press-fit contacts have through openings.

As is shown in a modification in FIG. 10, the press-fit contacts can in each case also have a through opening 46. Such through openings 46 can be produced during a compressive reshaping process, for example, or after a compressive reshaping process, for example by stamping out.

Figure 11A:
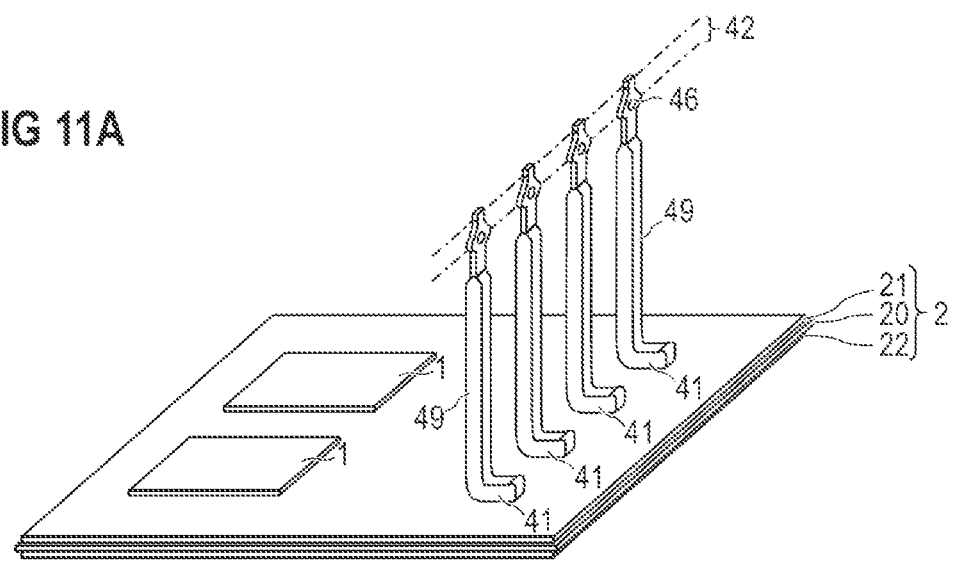
FIGS. 11A-11B, shows different steps of a method for producing a semiconductor module.
Figure 11B:
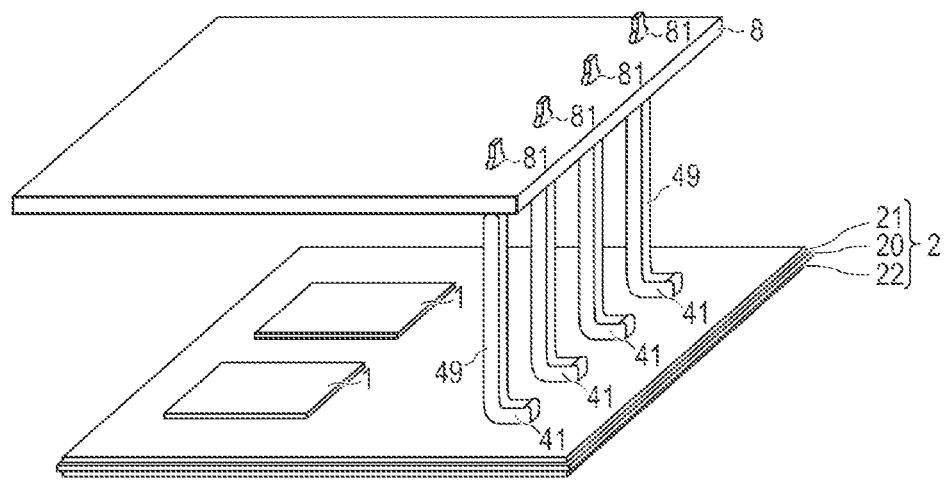

As is furthermore illustrated with reference to FIGS. 11A and 11B, two, three or more than three terminal conductors 49 can be electrically connected in parallel by being connected to a common connection conductor 8. Each of said terminal conductors 49 can be connected to the upper metallization 21 of a circuit carrier 2 by one of the methods explained above. Afterward, each of the terminal conductors 49 can be press-fitted by its second section 42 or its second end section 42 into a corresponding press-fit opening 81 in the connection conductor 8 to form an electrically conductive connection between the terminal conductor 49 and the connection conductor 8. Provided that the connection conductor 8 is arranged outside a module housing 10, the process of fitting the module housing 10 to the circuit carrier 2 populated with the terminal conductors 49 can be carried out before the press-fitting process. A correspondingly produced arrangement is shown in FIG. 12.

As an alternative thereto, a connection conductor 8 can also be situated within a module housing 10. In this case, firstly the second sections 42 or the second end sections 42 of the terminal conductors 49 are press-fitted into the press-fit openings 81 in the connection conductor 8 and then the module housing 10 is connected to the circuit carrier 2. Such an arrangement is shown in FIG. 13.

Figure 12:
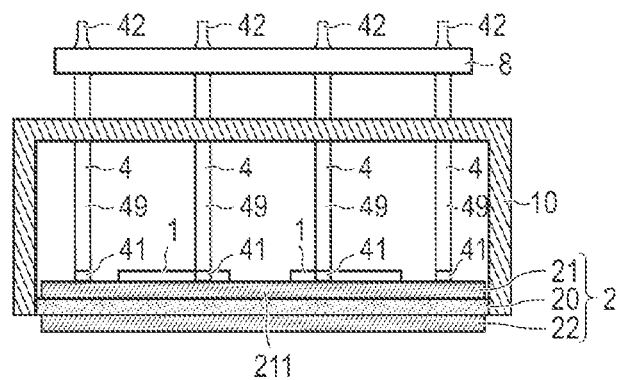
FIG. 12 shows a sectional view through a semiconductor module wherein a plurality of terminal conductors electrically connected in parallel are press-fitted into a common connection conductor situated outside a module housing.
Figure 13:
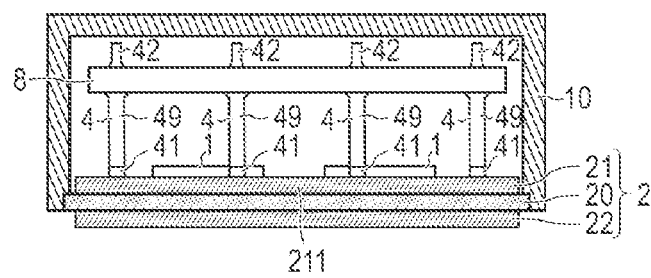
FIG. 13 shows a sectional view through a semiconductor module wherein a plurality of terminal conductors electrically connected in parallel are press-fitted into a common connection conductor situated within a module housing.
Figure 14A:
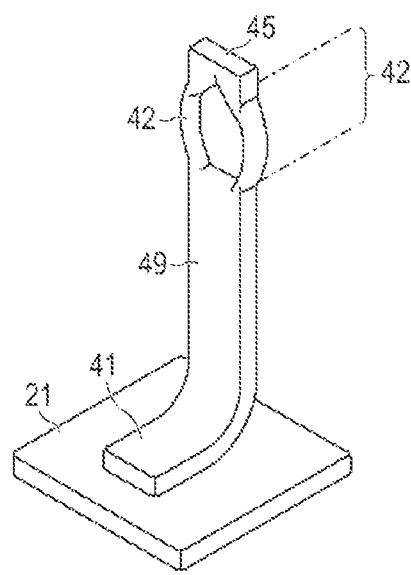
FIGS. 14A-14D, shows different examples of geometries which a terminal conductor can have in its second section.
Figure 14B:
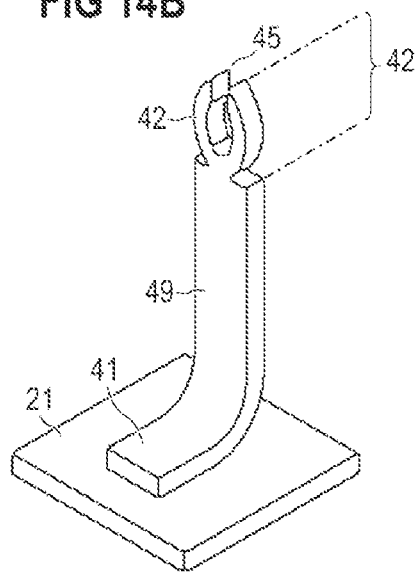
Figure 14C:
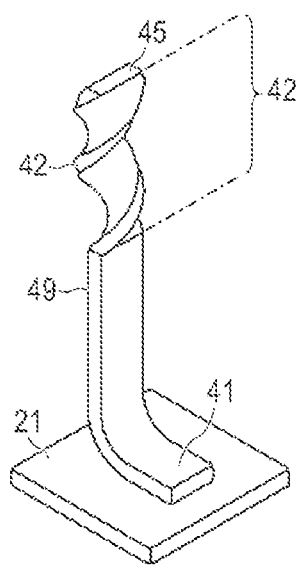
Figure 14D:
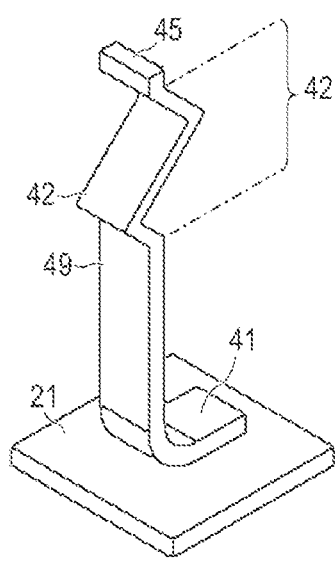

By connecting in parallel two, three or more of such terminal conductors 49, as shown by way of example in FIGS. 12 and 13, it is possible to produce a conductor structure having particularly low inductance. In the case of three or more of such terminal conductors 49, they can be arranged in a series one after another on the circuit carrier 2. The connection conductor can be, for example, a strip line or a printed circuit board. In the case of a printed circuit board, the latter can also be populated with further components, for example with driving electronics for driving the semiconductor chips 1 mounted on the circuit carrier 2.

As has been shown above, the arrangement or mounting of the circuit carrier 2 in the module housing 10 can be carried out after the production of the bonding connection between the terminal conductor 49 and the metallization layer 21, and thus also after the population of the circuit carrier 2 with the terminal conductor. In this case, the mounting can be carried out such that the second section or the second end section 42 projects from the module housing 10 and is thus situated outside the module housing 10.

If the connection conductor 8 is situated in the interior of the module housing 10 in the finished semiconductor module, the production of the electrically conductive connection between a connection conductor 8 and a terminal conductor 49 is carried out by the press-fit contact being press-fitted into the press-fit opening 81 before the mounting of the circuit carrier 2 in the module housing 10.

If, otherwise, the connection conductor 8 is situated outside the module housing 10 in the finished semiconductor module, the production of the electrically conductive connection between a connection conductor 8 and a terminal conductor 49 is carried out by the press-fit contact being press-fitted into the press-fit opening 81 after the mounting of the circuit carrier 2 in the module housing 10.

Provided that a second section 42 of a terminal conductor 49 is arranged outside a module housing 10, the housing 10 can have a guide channel into which the terminal conductor 49 is threaded with its second section 42 ahead when the housing 10 is placed onto the circuit carrier 2 populated with the terminal conductor 49. Such a guide channel then opens at the outer side of the housing in an opening through which the second section 42 is led, such that it is situated outside the housing 10. A fine adjustment of the terminal conductor 49 can be achieved by means of such a guide channel. Optionally, the guide channel can be widened in a funnel-shaped fashion in order to make it easier for the terminal conductor 49 to be threaded in. Moreover, the risk of the terminal conductor 49 buckling can be reduced with a guide channel. This may be relevant particularly if the terminal conductor 49 is intended to be press-fitted into a press-fit opening 81.

E) The Construction of Terminal Conductors

Various examples of geometries with which a terminal conductor 49 can be equipped by means of the reshaping of the wire 4 in the second section 42 thereof or by means of the reshaping of the terminal conductor 49 in the second end section 42 thereof are shown below with reference to FIGS. 14A to 14D. In all of the examples, the wire 4 or the terminal conductor 49 was embodied as a flat strip having a rectangular cross section before the reshaping process. In the example in accordance with FIG. 14A, the original width of the flat strip was increased and provided with a through opening. In the example in accordance with FIG. 14B, a small part of the flat strip was stamped out in order to produce a forked terminal pin. In the example in accordance with FIG. 14C, the originally flat strip in the second section 42 was twisted, and in the example in accordance with FIG. 14D it was reshaped to form a spring. The two variants in accordance with FIGS. 14C and 14D can be used for example for producing an electrically conductive pressure contact connection by the end 45 being pressed against a counterpart with which contact is to be made.

Figure 15A:
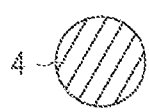
FIGS. 15A-15G, shows different examples of possible cross-sectional shapes of a wire that has not yet been reshaped and an example of a concavo-convex cross-sectional shape of a completed terminal conductor.
Figure 15B:
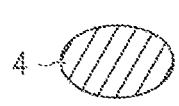
Figure 15C:
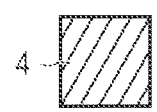
Figure 15D:
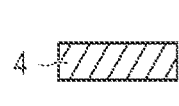
Figure 15E:
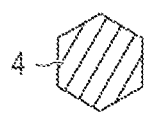
Figure 15F:

With reference to FIGS. 15A to 15F, an explanation will now be given of various examples of possible cross-sectional shapes of a wire 4 or terminal conductor 49 that has not yet been reshaped, such as can be used in conjunction with the methods explained above. The respective cross sections show the wire 4 or the terminal conductor 49 in a sectional plane E-E perpendicular to the direction of the course of the wire 4 or terminal conductor 49 (see FIGS. 1A, 2A, 3A and 4A). In this regard, the cross section can be, for example, circular (FIG. 15A), oval (FIG. 15B), square (FIG. 15C), rectangular but not square (FIG. 15D), hexagonal (FIG. 15E) or octagonal (FIG. 15F). In principle, the cross section of the wire 4 or terminal conductor 49 can be rotationally symmetrical about an n-fold symmetry axis running perpendicularly to the sectional plane E-E (n=2, 3, 4 . . . to infinity).

Figure 15G:
Figure 16A:
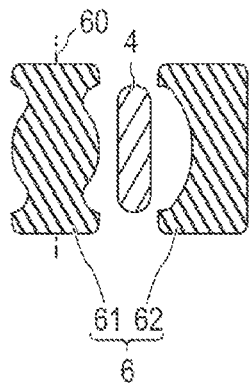
FIGS. 16A-16C, shows different steps of a method for producing a terminal conductor having a concavo-convex cross section.
Figure 16B:
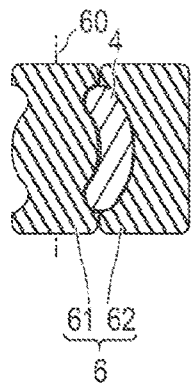
Figure 16C:
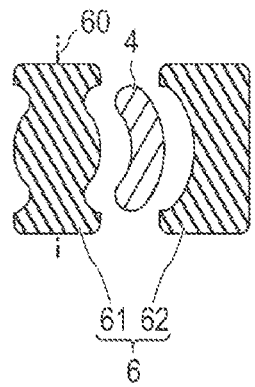

In accordance with a further configuration shown in FIG. 15G, the wire 4 or the finished terminal conductor 49 can have a non-rotationally symmetrical cross section after reshaping. Such a non-rotationally symmetrical cross section can be produced by the reshaping tool 6, for example, from one of the wires 4 having a rotationally symmetrical cross section as explained in FIGS. 15A to 15F. One possible method in this respect will be explained below with reference to FIGS. 16A to 16C. FIG. 16A shows a cross section through a wire 4 or terminal conductor 49 which has not yet been reshaped and which is led through between two parts 61 and 62 of a reshaping tool 6. The part 61 is rotatable about a rotation axis 60 perpendicular to the direction of the course of the wire 4 or terminal conductor 49. After the two parts 61 and 62 have been pressed against one another (FIG. 16B), the reshaping tool 6, with parts 61 and 62 pressed against one another, is guided along the wire 4, such that the part 61 rolls on the wire 4 or terminal conductor 49 and presses it against the part 62. In this case, the wire 4 or terminal conductor 49 is reshaped such that it has a convexo-concave cross section, as is shown by way of example in FIG. 16C after the opening of the reshaping tool 6. The mechanical stability of a finished terminal conductor 49 can be significantly increased by such a concavo-convex cross section. This is advantageous particularly if the terminal conductor 49 is intended to be press-fitted into an opening 81 in a connection element 8, since a higher press-fitting force can then be applied. The terminal conductor 49 can have the concavo-convex cross section substantially over the entire region between the second section 42 or second end section 42 and the last bonding location of the wire 4 or terminal conductor 49 preceding said second section 42 or second end section 42. By way of example, the terminal conductor 49 can have a concavo-convex cross section over a length of at least 30% of the distance d49 (see FIGS. 1G, 2D, 3D, 4D and 5D), which here corresponds to the distance between the separating location 45 and the circuit carrier 2. Moreover, it is pointed out that the concavo-convex cross section is not restricted to the geometry shown, rather that the invention encompasses any concavo-convex cross sections which can be produced by a reshaping tool rolling along the wire 4 or along the terminal conductor 49.

Generally, in the present invention, the distance d49 is given by the distance between the free end of the terminal conductor 49 (i.e. the free end situated at the second end section 42) and the circuit carrier 2. In the configurations of the invention wherein the terminal conductor 49 is also bent over by a bending angle φ1 after the bonding process, the distance d49 should be determined after the bending-over process. In all the configurations of the invention wherein the circuit carrier 2 is mounted in a module housing 10, the distance d49 is also present after the mounting of the circuit carrier 2 in the module housing 10. Generally, the distance d49 can be at least 4 mm, for example.

As already explained, all of the wire bonds at which a first section or end section 41, 41' is bonded onto a constituent part of a semiconductor module can be produced by means of ultrasonic wire bonding.

One advantage of a terminal conductor 49 produced according to the present invention or regarding a terminal conductor 49 is, moreover, that it can also be embodied in an integral fashion. In this case, it can optionally consist of a homogeneous material.

In principle, a quasi-continuous wire 4 and a terminal conductor 49 produced therefrom or a prefabricated terminal conductor 49 can consist of an arbitrary metal. One possible metal is e.g. copper, or a copper alloy comprising a copper proportion of at least 96% by weight. A further suitable metal is silver or a silver alloy comprising a silver proportion of at least 99.5% by weight. In the case of a copper alloy, a copper wire doped with zirconium (Zr) can be used, for example.

In accordance with one optional configuration of the invention, a terminal conductor 49, for example if its second section or end section 42 is intended to be press-fitted into a press-fit opening 81, in the region of the second section or end section 42, before the production of the bonding connection, or else after the production of the bonding connection and before possible reshaping, or else after possible reshaping and before press-fitting, can be coated with a layer composed of exactly one or a plurality of the materials silver (Ag), nickel (Ni), palladium (Pd) or tin (Sn). In particular, the wire 4 provided or the prefabricated terminal conductor 49 provided can already be provided with such a coating. The coating can be produced by electrodeposition, for example.

Figure 17A:
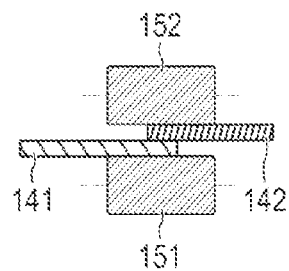
FIGS. 17A-17F, shows different steps of a method for producing a terminal conductor composed of two parts.
Figure 17B:
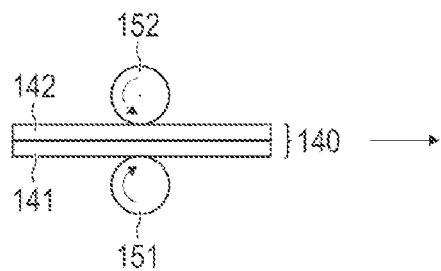
Figure 17C:
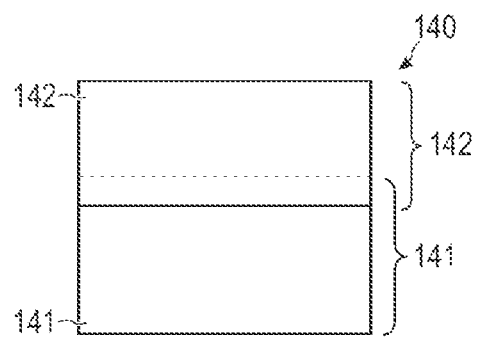
Figure 17D:
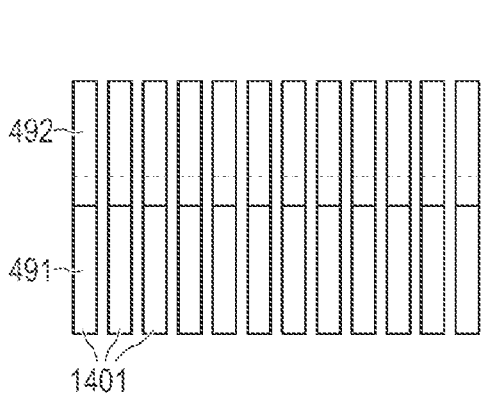
Figure 17E:
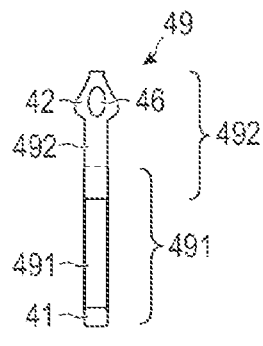
Figure 17F:
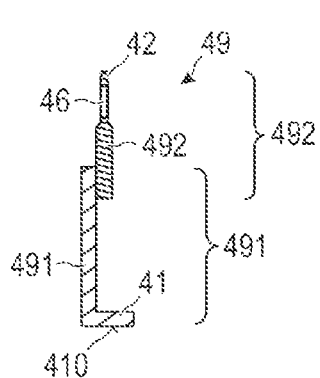
Figure 18A:
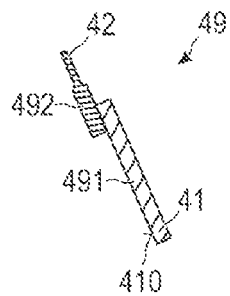
FIGS. 18A-18H, shows different configurations of a terminal conductor composed of two parts.
Figure 18B:
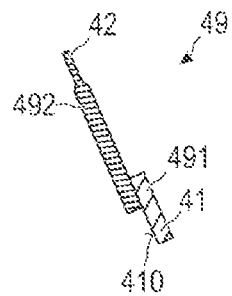
Figure 18C:
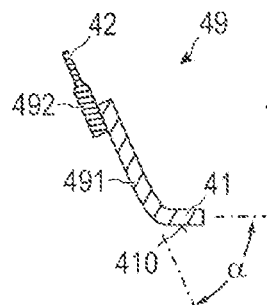
Figure 18D:
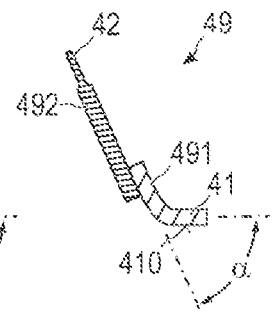
Figure 18E:
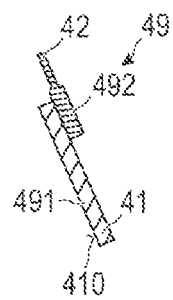
Figure 18F:
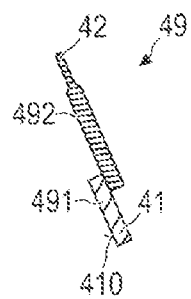
Figure 18G:
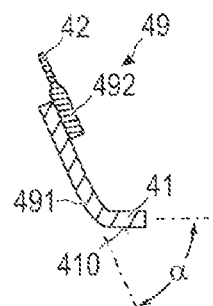
Figure 18H:
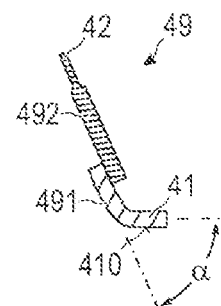

Instead of a prefabricated terminal conductor 49 consisting of one piece, a prefabricated terminal conductor 49, as is shown for example in FIG. 17E and in a side view in accordance with FIG. 17F, can also consist of two or more parts that are connected to one another cohesively, for example by welding, soft soldering, hard soldering, resistance welding, sintering or rolling.

Such a terminal conductor 49 comprising two or more parts cohesively connected to one another has a first section 491 composed of an electrically conductive first material, and also a second section 492 composed of an electrically conductive second material different than the first material, a first end section 41 and a second end section 42 opposite to the first end section 41. The second section 492 is cohesively connected to the first section 491 indirectly or directly. The first end section 41 is formed by a part of the first section 491, and the second end section 42 is formed by a part of the second section 492.

The production of such a terminal conductor 49 is explained below with reference to FIGS. 17A to 17F, wherein—merely by way of example—rolling is used as the connection technique.

Firstly, a first metal plate 141 composed of the electrically conductive first material and a second metal plate 142 composed of the second material are provided and then rolled with one another. For this purpose, the metal plates 141 and 142 are placed against one another in a manner overlapping one another and are rolled with one another, for example between two rollers 151, 152 pressed against one another, this being shown in cross section in FIG. 17A and in side view in FIG. 17B. After rolling, the metal plates 141 and 142 form a composite 140. FIG. 17C shows the composite 140 in plan view.

A plurality of strips 1401 can then be separated from the composite 140, for example by stamping or cutting, each of which strips has both a first section 491 of the first metal plate 141 and a second section 492 of the second metal plate 142, said second section being rolled with the first section 491. Each of the strips 1401 can then form a prefabricated terminal conductor 49, or a prefabricated terminal conductor 49 can be produced from each of the strips 1401.

Optionally, the second section 492 can also be reshaped at its free end, thus giving rise to a second end section 42 which is embodied as a press-fit contact or as a soldering terminal, or which has a screw-on opening.

Instead of the metal plates 141 and 142 being rolled with one another, they can also be cohesively connected to one another by any other connection techniques, for example welding, soft soldering, hard soldering, resistance welding or sintering. All further processing steps can be carried out in the manner as described for the rolling.

In the case of sintering, for this purpose, in the overlap region of the metal plates 141 and 142, a connection medium is introduced between the metal plates 141 and 142. While the metal plates 141 and 142 are then pressed against one another, connection medium situated between them is sintered. The connection medium can be for example a paste containing a metal powder, e.g. silver or copper, and also a solvent.

Likewise optionally, the terminal conductor 49 can also be pre-bent by an angle α in the region of the second section 492, thus giving rise to a prefabricated terminal conductor 49 which fulfils the criteria explained above with reference to FIG. 5A.

A prefabricated terminal conductor 49 explained above with reference to FIGS. 17A to 17F can then be cohesively connected to a metallization 21 of a circuit carrier 2 by bonding, as has been explained above with reference to FIGS. 5A to 5G. In this case, it is possible to provide a multiplicity of such terminal conductors 49 in a magazine or in the form of a tape, as explained with reference to FIGS. 6, 7 and 8.

Further examples of such prefabricated terminal conductors 49 are shown in FIGS. 18A to 18H. As is illustrated in FIGS. 18A, 18C, 18E and 18G, in a terminal conductor 49 the first section 491 can have a longer length than the second section 492. Conversely, however, the second section 492 can also have a longer length than the first section 491, this being shown in each case in FIGS. 18B, 18D, 18F and 18H.

Moreover, the joint at which the cohesive connection between the sections 491 and 492 is situated can be arranged either at the same side of the first section 491 at which the later bonding location 410 is also situated (FIGS. 18A, 18B, 18C, 18D), or at the opposite side (FIGS. 18E, 18F, 18G, 18H).

Furthermore, the terminal conductor 49, in the region of the first section 491, as already explained, can have a pre-bend by an angle $0°<\alpha\leq 90°$, this being shown in FIGS. 18C, 18D, 18G and 18H, or no pre-bend, this corresponding to an angle $\alpha=0°$ and being shown in FIGS. 18A, 18B, 18E and 18F. If no pre-bend is present, the terminal conductor 49 can be bonded on by firstly being pressed onto the metallization 21 by the sonotrode 5 and being pre-bent in the process and then being bent over in the manner explained with reference to FIGS. 5C to 5H.

With a terminal conductor composed of two or more parts of different materials, what can be achieved, for example, is that the terminal conductor 49 predominantly has a low electrical resistance, e.g. by virtue of the first material having an electrical resistivity of less than 19E-05 ohms·cm or of less than 17*E-05 ohms·cm. By way of example, high-purity copper (Cu) or copper having small impurities is suitable as suitable material for the first section 491. Independently thereof, by way of example, Cu having small additives which bring about a higher stiffness, e.g. CuZr or CuFe2P, is suitable as material for the second section 492, with the proviso that the sections 491 and 492 consist of different materials.

Independently thereof, what can be achieved is that the terminal conductor 49 has a good bondability for bonding onto the metallization layer 21, which can be achieved for example by means of a coating with high-purity Cu or Cu having small impurities (see conductivities above). In addition, what can be achieved is that the terminal conductor 49, if its second end section 42 has a press-fit contact, has a high mechanical stability, for example by the press-fit zone 42 being produced from Cu having small impurities which lead to a higher stiffness and hardness (e.g. CuZr, CuFe2P).

Figure 19:
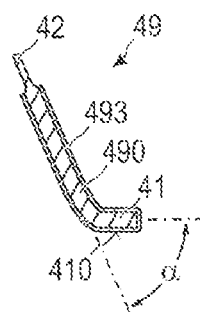
FIG. 19 shows a prefabricated terminal conductor provided with an electrodeposited layer.
Figure 20:
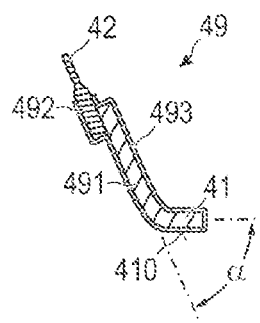
FIG. 20 shows a prefabricated terminal conductor provided with an electrodeposited layer and having two sections of different materials cohesively connected to one another.

FIGS. 19 and 20 show prefabricated terminal conductors 49 each having an electrodeposited coating 493. The electrodeposited coating 493 can be composed, for example, of Sn, Ag, Ni/Au, high-purity Cu. In this case, the electrodeposited coating 493 can optionally be omitted in the region of the second end section 42. The terminal conductor 49 in accordance with FIG. 19 has a core 490, which can consist of copper, for example. Likewise, in the case of the terminal conductor 49 in accordance with FIG. 20, the second section 492 can consist of copper, for example.

Within the meaning of the present invention, a "prefabricated" terminal conductor 49 is understood to be, in particular, such terminal conductors 49 which, in the region of the second end section 42 at which an electrical connection of the finished semiconductor module is produced, are no longer altered geometrically after the terminal conductor has been bonded onto the metallization layer 21.

Insofar as one of the terminal conductors 49 explained above is intended to be press-fitted into a press-fit opening 81 and is accordingly intended to be equipped with a press-fit contact, the press-fit contact, the associated press-fit opening 81 and the production of a press-fit connection can optionally be configured and carried out according to DIN EN 60352-5, version as of April 2004.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor module, the method comprising:
   providing a circuit carrier having a metallization layer, an electrically conductive wire and a bonding device;
   producing a bonding connection between the metallization layer and a first section of the wire at a bonding location of the first section by means of the bonding device;
   defining a separating location of the wire;
   defining a second section of the wire which is spaced apart from the separating location;
   reshaping the wire in the second section at a reshaping location of the second section;
   severing the wire at the separating location such that a terminal conductor of the semiconductor module is formed from a part of the wire, the terminal conductor being bonded to the metallization layer and having a free end at the separating location and a bonded end corresponding to the first section bonded to the metallization layer,
   wherein between the bonding location and the reshaping location, the wire is disposed at a first angle with respect to the metallization layer while the bonding connection is being produced,
   wherein between the bonding location and the reshaping location, the wire is disposed at a second angle greater than the first angle with respect to the metallization layer after being reshaped,
   wherein the wire has a cross-sectional area of at least 0.6 mm$^2$ perpendicular to a direction of its course before reshaping and before the production of the bonding connection.

2. A method for producing a semiconductor module, the method comprising:
   providing a circuit carrier having a metallization layer;
   providing a terminal conductor having:
   a first section composed of an electrically conductive first material;
   a second section composed of an electrically conductive second material different than the first material, the second section being cohesively connected to the first section indirectly or directly;
   a first end section and a second end section opposite to the first end section, the first end section being formed by a part of the first section and the second end section being formed by a part of the second section;
   providing a bonding device;
   providing a module housing;
   producing a bonding connection between the metallization layer and the first section at a bonding location of the first end section by means of the bonding device in such a way that the first end section is directly connected to the metallization layer;
   subsequent to producing the bonding connection, bending over the second end section relative to the circuit carrier at a bending location of the second end section,
   wherein between the bonding location and the bending location, the terminal conductor is disposed at a first angle with respect to the metallization layer while the bonding connection is being produced,
   wherein between the bonding location and the bending location, the terminal conductor is disposed at a second angle greater than the first angle with respect to the metallization layer after the bending step is completed; and
   arranging the circuit carrier in the module housing after producing the bonding connection in such a way that the second end section projects from the module housing.

3. The method of claim 2, wherein providing the terminal conductor comprises:
   providing a first metal plate composed of the electrically conductive first material;
   providing a second metal plate composed of the second material;
   producing a composite by rolling the first metal plate with the second metal plate; and
   separating a strip, which forms the terminal conductor or from which the terminal conductor is produced before producing the bonding connection, from the composite in such a way that the strip has both a first section of the first metal plate and a second section of the second metal plate, the second section being rolled with the first section.

4. The method of claim 2, wherein the circuit carrier has a dielectric isolation carrier to which the metallization layer is applied.

5. The method of claim 4, wherein the dielectric isolation carrier has a thickness of less than or equal to 2 mm.

6. The method of claim 4, wherein the dielectric isolation carrier is a ceramic.

7. A method for producing a semiconductor module, the method comprising:
   providing a circuit carrier having a metallization layer, an electrically conductive wire and a bonding device;
   producing a bonding connection between the metallization layer and a first section of the wire at a bonding location of the first section by means of the bonding device;
   defining a separating location of the wire;
   defining a second section of the wire which is spaced apart from the separating location;
   reshaping the wire in the second section at a reshaping location of the second section;
   severing the wire at the separating location such that a terminal conductor of the semiconductor module is formed from a part of the wire, the terminal conductor being bonded to the metallization layer and having a free end at the separating location and a bonded end corresponding to the first section bonded to the metallization layer,
   wherein between the bonding location and the reshaping location, the wire is disposed at a first angle with respect to the metallization layer while the bonding connection is being produced, wherein between the bonding location and the reshaping location, the wire is disposed at a second angle greater than the first angle with respect to the metallization layer after being reshaped, wherein the wire has in the second section in a first direction a first minimum width before reshaping and a second minimum width after reshaping, and wherein the second minimum width is less than the first minimum width by at least 30% of the first minimum width.

8. The method of claim 7, wherein a first location of the second section, at which the second section has the second minimum width after reshaping, is spaced apart from the separating location by a distance of at least the same magnitude as the first minimum width.

9. The method of claim 7, further comprising:
providing a module housing;
arranging the first section in an interior of the module housing; and
arranging the free end outside the module housing.

10. The method of claim 7, wherein the wire is provided on a roll and that part of the wire which still situated on the roll after separation has a further first section which is bonded to the metallization layer by means of the bonding device.

11. The method of claim 7, wherein the wire has a cross-sectional area of at least 0.6 mm² perpendicular to a direction of its course before reshaping and before the production of the bonding connection.

12. The method of claim 7, further comprising:
providing a module housing; and
arranging the first section and the free end in an interior of the module housing.

13. The method of claim 7, wherein a press-fit contact according to DIN EN 60352-5 is formed by the reshaping, the method further comprising:
providing a connection conductor having an opening; and
producing an electrically conductive connection between the connection conductor and the terminal conductor by press-fitting the press-fit contact into the opening.

14. The method of claim 13, wherein the wire at least in the region of the second section is coated with one or more of: silver (Ag), tin (Sn), nickel (Ni), and palladium (Pd).

15. The method of claim 7, wherein the wire has in the second section in a second direction a first maximum width before reshaping, and in the second direction a second maximum width after reshaping, the second maximum width being greater than the first maximum width by at least 20% of the first minimum width.

16. The method of claim 15, wherein a second location of the second section, at which the second section has the second maximum width after reshaping, is spaced apart from the separating location by a distance corresponding at least to the second maximum width.

17. The method of claim 7, wherein the terminal conductor has after reshaping a section having a convexo-concave cross-section over its entire length.

18. The method of claim 17, wherein the entire length of the terminal conductor is at least 30% of the distance between the separating location and the circuit carrier.

* * * * *

UNITED STATES PATENT AND TRADEMARK OFFICE
CERTIFICATE OF CORRECTION

PATENT NO. : 10,032,743 B2
APPLICATION NO. : 14/296678
DATED : July 24, 2018
INVENTOR(S) : Bayerer et al.

Page 1 of 1

It is certified that error appears in the above-identified patent and that said Letters Patent is hereby corrected as shown below:

In the Claims

Column 17, Line 21 (Claim 10, Line 2) please change "which still" to -- which is still --

Signed and Sealed this
Second Day of October, 2018

Andrei Iancu
*Director of the United States Patent and Trademark Office*